US008516406B1

(12) United States Patent
Lai et al.

(10) Patent No.: US 8,516,406 B1
(45) Date of Patent: Aug. 20, 2013

(54) METHODS, SYSTEMS, AND ARTICLES OF MANUFACTURE FOR SMART PATTERN CAPTURING AND LAYOUT FIXING

(75) Inventors: Ya-Chieh Lai, Sunnyvale, CA (US); Frank Gennari, San Jose, CA (US); Olivier Omedes, Roquefort Les Pins (FR); Olivier Pribetich, Vallauris (FR)

(73) Assignee: Cadence Design Systems, Inc., San Jose, CA (US)

( * ) Notice: Subject to any disclaimer, the term of this patent is extended or adjusted under 35 U.S.C. 154(b) by 116 days.

(21) Appl. No.: 12/982,712

(22) Filed: Dec. 30, 2010

Related U.S. Application Data

(60) Provisional application No. 61/354,212, filed on Jun. 12, 2010.

(51) Int. Cl.
G06F 17/50 (2006.01)
(52) U.S. Cl.
USPC .................. 716/54; 716/52; 716/55; 716/132
(58) Field of Classification Search
None
See application file for complete search history.

(56) References Cited

U.S. PATENT DOCUMENTS

| | | | | | |
|---|---|---|---|---|---|
| 5,587,918 | A | * | 12/1996 | Hamada et al. | 716/136 |
| 6,052,516 | A | | 4/2000 | Tajima | |
| 6,523,162 | B1 | * | 2/2003 | Agrawal et al. | 716/53 |
| 6,670,080 | B2 | * | 12/2003 | Sugita et al. | 430/5 |
| 7,278,118 | B2 | * | 10/2007 | Pileggi et al. | 716/55 |
| 7,539,970 | B2 | * | 5/2009 | Jung et al. | 716/54 |
| 7,698,665 | B2 | * | 4/2010 | Abrams et al. | 716/55 |
| 7,735,053 | B2 | * | 6/2010 | Harazaki | 716/53 |
| 7,861,193 | B2 | | 12/2010 | Meserve | |
| 7,934,174 | B2 | | 4/2011 | Tang et al. | |
| 8,161,448 | B1 | | 4/2012 | Croix et al. | |
| 8,312,413 | B2 | | 11/2012 | Stellari et al. | |
| 2003/0061592 | A1 | | 3/2003 | Agrawal et al. | |
| 2005/0268256 | A1 | * | 12/2005 | Tsai et al. | 716/4 |
| 2007/0006114 | A1 | * | 1/2007 | Scheffer et al. | 716/19 |
| 2007/0101310 | A1 | | 5/2007 | Stirniman et al. | |

(Continued)

FOREIGN PATENT DOCUMENTS

EP 0651337 A1 5/1995
JP 05028274 A 2/1993

OTHER PUBLICATIONS

Non-Final Office Action dated Jun. 27, 2012 for U.S. Appl. No. 12/982,693.
Non-Final Office Action dated Oct. 2, 2012 for U.S. Appl. No. 12/982,730.

(Continued)

Primary Examiner — Leigh Garbowski
(74) Attorney, Agent, or Firm — Vista IP Law Group, LLP

(57) ABSTRACT

Various embodiments are directed at methods and systems for implementing automatic fixing of a layout, implementing fuzzy pattern replacement, and implementing pattern capturing in a layout of an electronic circuit design. Various processes or modules comprise the act or module of identifying a first pattern from within an electronic circuit layout. The processes or modules also comprise identifying a fixing process or a replacement pattern for the first pattern and the act of performing pattern replacement or pattern fixing on the first pattern. The processes or modules may further comprise the act or module of searching the layout for patterns that match the first pattern, and the act or module of performing pattern replacement of pattern fixing on the patterns that match the first pattern. Some embodiments are also directed at articles of manufacture embodying a sequence of instructions for implementing the processes described here.

27 Claims, 23 Drawing Sheets

(56) References Cited

U.S. PATENT DOCUMENTS

| | | |
|---|---|---|
| 2008/0003510 A1 | 1/2008 | Harazaki |
| 2008/0189673 A1* | 8/2008 | Ying .............................. 716/21 |
| 2009/0199148 A1 | 8/2009 | Kyoh et al. |
| 2009/0271749 A1 | 10/2009 | Tang et al. |
| 2009/0288047 A1 | 11/2009 | Tang et al. |
| 2010/0185999 A1 | 7/2010 | Graur et al. |
| 2011/0219352 A1* | 9/2011 | Majumder et al. ............ 716/139 |
| 2012/0042290 A1 | 2/2012 | Berkens et al. |

OTHER PUBLICATIONS

Notice of Allowance dated Dec. 13, 2012 for U.S. Appl. No. 12/982,693.

Final Office Action dated Jan. 24, 2013 for U.S. Appl. No. 12/982,730.

Notice of Allowance dated May 24, 2013 for U.S. Appl. No. 12/982,730.

* cited by examiner

METHODS, SYSTEMS, AND ARTICLES OF MANUFACTURE FOR SMART PATTERN CAPTURING AND LAYOUT FIXING

CROSS-REFERENCE TO RELATED APPLICATION(S)

This application claims the benefit of U.S. Provisional Application Ser. No. 61/354,212 which is entitled "METHODS, SYSTEMS, AND ARTICLES OF MANUFACTURE FOR SMART PATTERN CAPTURING AND LAYOUT FIXING" filed on Jun. 12, 2010, the contents of which are expressly incorporated by reference in their entireties. This application is cross-related to U.S. application Ser. No. 11/609,901, now U.S. Pat. No. 7,818,707, filed on Dec. 12, 2006 and entitled "FAST PATTERN MATCHING", U.S. application Ser. No. 12/133,563, filed on Jun. 5, 2008 and entitled "METHOD AND SYSTEM FOR MODEL-BASED DESIGN AND LAYOUT OF AN INTEGRATED CIRCUIT", and U.S. application Ser. No. 12/241,409, filed Sep. 30, 2008 and entitled "METHOD AND SYSTEM FOR PERFORMING PATTERN CLASSIFICATION OF PATTERNS IN INTEGRATED CIRCUIT DESIGNS", the contents of all the aforementioned applications are expressly incorporated by reference in their entireties.

This application is further cross related to U.S. application Ser. No. 12/982,693, filed currently with the instant Application on Dec. 30, 2010 and entitled "METHODS, SYSTEMS, AND ARTICLES OF MANUFACTURE FOR SMART PATTERN CAPTURING AND LAYOUT FIXING", and U.S. application Ser. No. 12/982,730, filed currently with the instant Application on Dec. 30, 2010 and entitled "METHODS, SYSTEMS, AND ARTICLES OF MANUFACTURE FOR SMART PATTERN CAPTURING AND LAYOUT FIXING". The contents of both applications are hereby expressly incorporated by reference in their entireties.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

A semiconductor integrated circuit (IC) has a large number of electronic components, such as transistors, logic gates, diodes, wires, etc., that are fabricated by forming layers of different materials and of different geometric shapes on various regions of a silicon wafer.

The various components of an integrated circuit are initially defined by their functional operations and relevant inputs and outputs. From the HDL (hardware description language) or other high level description, the actual logic cell implementation is typically determined by logic synthesis, which converts the functional description of the circuit into a specific circuit implementation.

An integrated circuit designer may use a set of EDA application programs to create a physical integrated circuit design layout from a logical circuit design. The EDA application uses geometric shapes of different materials to create various electrical components on an integrated circuit and to represent electronic and circuit IC components as geometric objects with varying shapes and sizes. During this process, the design components are "placed" (e.g., given specific coordinate locations in the circuit layout) and "routed" (e.g., wired or connected together according to the designer's circuit definitions).

Conventional EDA tool often performs various pattern matching operations for various purposes such as verification or optimization by invoking various EDA applications running on one or more computing nodes. Moreover, each of these EDA applications usually operates on an instance of the layout of the electronic circuit design to perform its own designated functions. For example, a layout editor may open an instance of the layout to perform its designated functions such as schematic entry, circuit simulation, custom layout, physical verification, extraction, etc. In the meantime, a place and route tool may open another instance of the layout to perform its placement and routing functions. Therefore, if there exists a problematic area within the layout, the user or designer often needs to invoke, for example, both the place and route tool and the layout editor to fix the problematic area in the layout. Such a process often involves one or more round-trips between the respective computing nodes on which the place and route tool and the layout editor reside or large amount of data transmission between the place and route tool and the layout editor.

Recent place and route tool development has envisioned so called DFM-aware (design for manufacturing) routers. In such an approach, the router is supplied with some rule-based or model-based DFM data to aid the router to route the design with potentially fewer DFM issues. Nonetheless, with the layout editor performing various verification and simulation functions, such an approach still requires transfer of vast amount of data between the placement and route tool and the layout editor.

Therefore, there exists a need for methods, systems, and articles of manufacture for smart pattern capturing and layout fixing.

SUMMARY

Disclosed are various embodiments of methods, systems, and articles of manufactures for implementing pattern capturing in a layout of an electronic circuit design. In some embodiments, the methods or systems comprise the processes or modules for identifying a first set of one or more layers, identifying a first pattern, identifying one or more patterns that match the first pattern by at least searching against the first set of one or more layers or purposes (hereinafter layer), and storing the one or more patterns in a non-transitory computer readable storage medium or displaying the one or more patterns in a display apparatus.

In some embodiments, the processes or system may further comprise one or more of the acts or modules of identifying or determining one or more key areas or one or more don't-care areas for the first pattern, analyzing the first pattern to determine an effect of the first pattern on the electronic circuit design, performing one or more post-capturing actions on the one or more patterns, and performing one or more post-action actions on the one or more patterns. Some embodiments are directed at articles of manufacture embodying a sequence of instructions for implementing these processes.

In some embodiments, the methods or system comprise the processes or modules for implementing fuzzy pattern replacement in a layout of an electronic circuit design. The methods or systems comprise the processes or modules of identifying a first pattern from within the layout, identifying one or more second pattern based at least on one or more don't-care areas of the first pattern, and performing the fuzzy replacement by replacing the first pattern with at least one of the plurality of second patterns in the layout. Some embodiments are directed at articles of manufacture embodying a sequence of instructions for implementing these processes.

In some embodiments, the processes or system may further comprise one or more of the acts or modules of identifying one or more patterns that match the first pattern by at least searching against one or more layers or purposes of the layout for the one or more patterns, performing the fuzzy replacement by replacing the one or more patterns with the second pattern in the layout, determining a decomposition scheme that decomposes the first pattern into a plurality of sub-patterns for a double patterning process, determining the at least one of the plurality of second patterns based at least in part upon a context in which the first pattern resides, and adjusting the at least one of the plurality of second patterns after the at least one of the plurality of second patterns is used to replace the first pattern to improve the electronic circuit design.

In some embodiments, the methods or system comprise the processes or modules for implementing automatic fixing of a layout of an electronic circuit design. The methods or systems comprise the processes or modules of identifying a first pattern from within the layout, receiving or identifying a fixing process for the first pattern, performing the fixing process to the first pattern, and associating the fixing process with the first pattern in some embodiments.

The methods or the systems may further comprise one or more of the acts or modules of analyzing the result of the act of performing the fixing process within a context in which the first pattern is situated, identifying one or more patterns that match the first pattern on one or more layers or purposes in the layout, performing the fixing process on the one or more patterns that match the first pattern in some embodiments.

The methods or the systems may further comprise one or more of the acts or modules of adjusting the first pattern after the fixing process is performed on the first pattern to improve the electronic circuit design and performing a minimum perturbation fixing process in some embodiments. Some embodiments are directed at articles of manufacture embodying a sequence of instructions for implementing these processes. Some embodiments are directed at articles of manufacture embodying a sequence of instructions for implementing these processes.

BRIEF DESCRIPTION OF THE FIGURES

The drawings illustrate the design and utility of preferred embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Various embodiments of the invention are directed to methods, systems, and articles of manufacture for smart pattern capturing and layout fixing. Other objects, features, and advantages of the invention are described in the detailed description, figures, and claims.

Various embodiments of the methods, systems, and articles of manufacture will now be described in detail with reference to the drawings, which are provided as illustrative examples of the invention so as to enable those skilled in the art to practice the invention. Notably, the figures and the examples below are not meant to limit the scope of the present invention. Where certain elements of the present invention can be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, the present invention encompasses present and future known equivalents to the components referred to herein by way of illustration.

Figure 1:
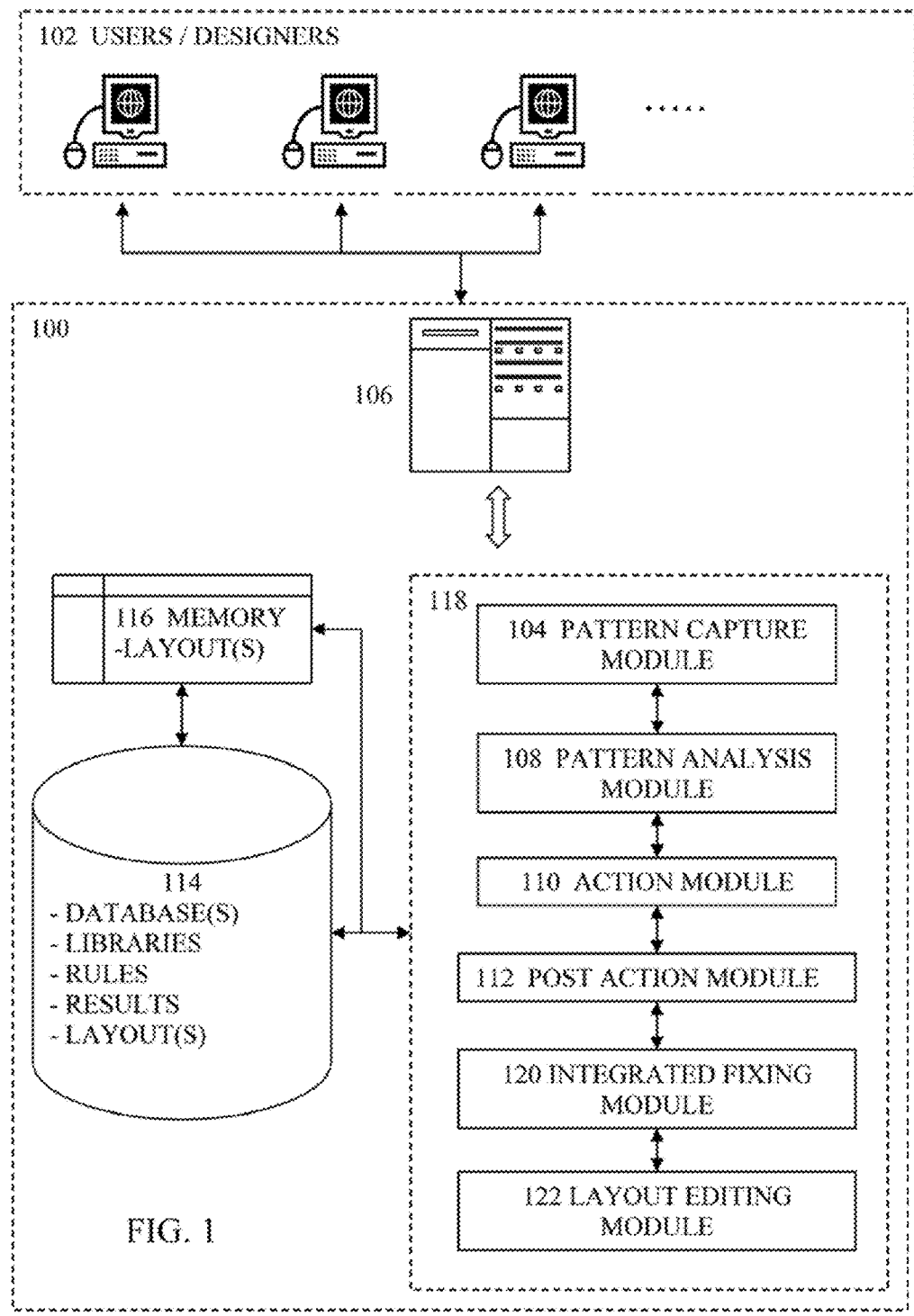
FIG. 1 illustrates a high level architectural view of some embodiments directed to a system for smart pattern capturing and layout fixing that interacts with one or more users or designers in some embodiments.

Referring to FIG. 1 which illustrates a high level architectural view of some embodiments directed to a system 100 for smart pattern capturing and layout fixing that interacts with one or more users or designers 102 in some embodiments. In these embodiments that are directed to systems for smart pattern capturing and layout fixing, the system 100 comprises a computing system 106 as described with reference to FIG. 16. The computing system 106 comprises some non-transitory computer readable storage medium 116 such as RAM (random access memory) in which one or more layouts of electronic circuit designs may be loaded. The computing system 106 may further comprise or interact with another non-transitory computer readable storage medium 114 such as a disk drive on which various data or information, such as databases, libraries, rules, layouts, or various results of various modules, is stored.

The computing system 106 may further comprise various modules 118 including one or more of a pattern capture module 104, a pattern analysis module 108, an action module 110, a post action module 112, an integrated fixing module 120, and a layout editing module 122. In some embodiments, the integrated fixing module 120 and the layout editing module 122 constitute two separate modules. In some other embodiments, the integrated fixing module 120 is integrated within the layout editing module 122 where a user or a designer using the layout editing module 122 may invoke the integrated fixing module 120 to perform the complete functions of the integrated fixing module 120. An exemplary layout editing module 122 comprises, for example, an IC layout editor.

The pattern capture module 104 captures one or more patterns in the layout based at least in part on certain input in some embodiments, and will be described in more details in subsequent paragraphs with references to one or more figures. In some embodiments, the input comprises, for example, a pattern in the layout that is interactively identified by the user. In some embodiments, the input comprises a known-good pattern that is identified from, for example, a database of patterns. In some embodiments, the input comprises, for example, a known bad pattern that is known to cause problems such as negative impact on yield. In some embodiments, this known bad pattern is identified from, for example, a database of patterns. The pattern analysis module 108 performs various processes or actions to analyze one or more patterns, which various processes will be described in more details in subsequent paragraphs with references to one or more figures. In some embodiments, the various processes or actions comprise the process for determining a fuzzy or inexact (hereafter fuzzy) match. In some embodiments of this fuzzy match, the match metric is defined using one or more key areas, zero or more don't-care areas, or one or more space or empty areas in an identified pattern. In some embodiments of fuzzy match, the match metric is defined using an area correlation. In some embodiments, the various processes or actions comprise the process for scanning one or more don't-care areas to determine where or how to modify one or more patterns. In some embodiments, the various processes or actions comprise the process for determining decomposition of a pattern for double patterning in a lithography process.

The action module 110 performs various processes or actions on one or more patterns in some embodiments, which various processes or actions will be described in more details in subsequent paragraphs with references to one or more figures. In some embodiments, the various processes or actions comprise, for example, layout compaction, verification, or design optimization. The post action module 112 performs various actions or processes such as persistently storing the results of one or more processes or actions after the action module 110 has completed its designated processes or actions in some embodiments. In some embodiments, the one or more processes or actions performed by the post action module 112 may comprise, for example, providing reports, review, recommendations, or graphical or textual results of various processes or actions in a user interface or graphical user interface.

The integrated fixing module 120 performs various processes or actions on the layout in some embodiments, which various processes or actions will be described in more details in subsequent paragraphs with reference to various figure(s) in some embodiments. In some embodiments, the various processes or actions comprise, for example, layout fixing capturing and reproduction, script editing or drafting for layout fixing, performing double cut insertion, pattern replacement, re-targeting, DFM issue fixing, fixing process description, rip-up and reroute, incremental re-route, incremental placement, etc. In some embodiments, the layout editing module performs various processes or actions that a commercially available layout editor may perform, which various processes or action comprise, for example, simulation, schematic entry, circuit simulation, custom layout, physical verification, extraction, etc.

It shall be noted that some or all of these modules in 118 may be implemented in software, hardware, or a combination thereof, and all these modules interacts with various hardware components such as one or more processors and physical memories to perform various processes or actions as described herein. It shall also be noted that some of these modules may be combined as one single module. For example, the action module 110 and the integrated fixing module 120 may be combined into a single module to perform various actions or processes in some embodiments.

In various embodiments, various modules are operating upon patterns in one or more layouts of an electronic circuit design. A pattern may comprise a portion of the layout in some embodiments. A pattern may also comprise a cell or an instance of a cell in the layout in some embodiments. A pattern may further comprise one or more geometries or shapes in the layout in some embodiments. Moreover, various modules operate upon a pattern of the layout by treating the pattern as an image such as a two-dimensional or multi-dimensional image in some embodiments. For example, a pattern may comprise an actual printed or simulated image of the corresponding portion of the layout in these embodiments. Various modules may also treat a pattern as a geometric pattern such as an as-drawn polygon for an interconnect in some embodiments. Various modules may further treat a pattern as a set of data points, such as a set of coordinates defining the corners of a pattern, in some embodiments.

In various embodiments, the various modules in 118 interact with the non-transitory computer readable storage medium 116 and 114 to read data from or write data to. In some embodiments, at least the integrated fixing module 120 and the layout editing module 122 are sharing the non-transitory computer readable storage medium 116 such that both the integrated fixing module 120 and the layout editing module 122 are operating upon the same layout of an electronic circuit design. The sharing of the non-transitory computer readable storage medium 116 between the integrated fixing module 120 and the layout editing module 122 eliminates data transfer between the integrated fixing module 120 and the layout editing module 122 because both modules 120 and 122 are operating upon the same layout.

Figure 2:
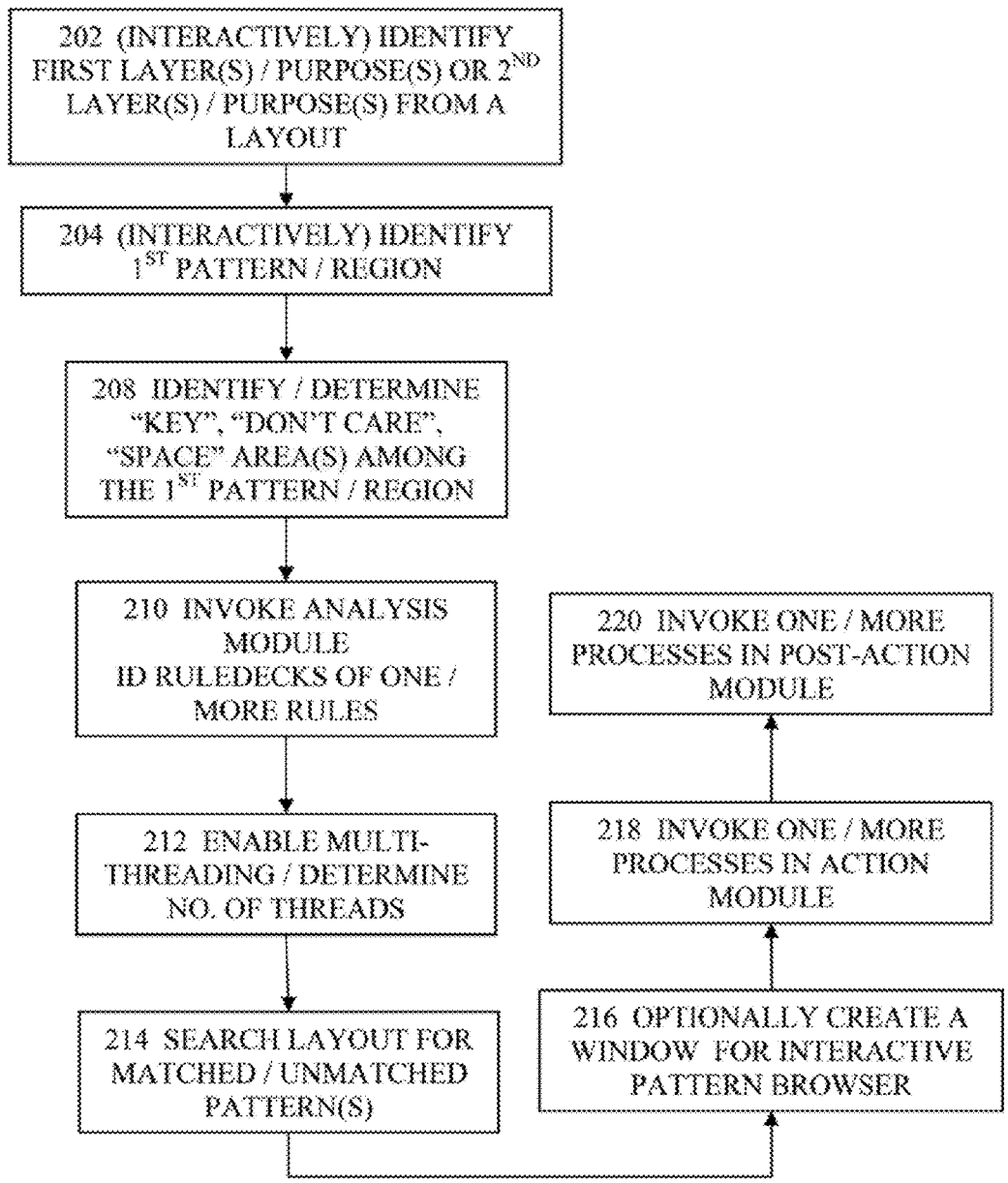
FIG. 2 illustrates a high level flow diagram of a process or system for smart pattern capturing in an electronic circuit layout in some embodiments.

Referring to FIG. 2 which illustrates a high level flow diagram of a process or system for smart pattern capturing in an electronic circuit layout in some embodiments. In some embodiments, the process or system for smart pattern capturing comprises the act or module of identifying a first set of layers or purposes from a layout, 202. In these embodiments, the first set of layers comprises one or more layers that will be searched against to identify one or more patterns (hereinafter matched patterns) that match against certain designated pattern(s). More details about identifying the one or more matched patterns will be described in subsequent paragraphs with references to various figure(s).

In some embodiments, the process or system for smart pattern capturing further comprises identifying a second set of layers or purposes from the layout at 202. In some embodiments, the second set of layers or purposes is used to identify a pattern of interest that may be used to identify other matched patterns in the layout. In various embodiments, a layer denotes a layer in a semiconductor film stack. For example, a layer may refer to metal-1, a poly-silicon layer, a metal-5 layer, etc. A modern semiconductor film stack often comprises more than 20 layers, each of which may be designated or identified by the processes or systems as described in various embodiments of the Specification. It shall also be noted that a router or a routing engine does not usually operate upon or use the metal-1 layer or a poly-silicon layer. Nonetheless, the processes or systems described herein may also apply to the metal-1 and poly-silicon layers. In some embodiments, a purpose comprises a single data type of a layer. A layer may comprise multiple purposes or multiple data types in some embodiments. In some embodiments, a purpose does not correspond to more than one layer. In some embodiments, the process or action 202 comprises receiving a user's interactive selection or identification of the first set of layers or the second set of layers by, for example, interactively clicking on one or more visible layers in the user interface or graphical user interface. Some examples will be provided in subsequent paragraphs with references to one or more figures.

In some embodiments, the process or system for smart pattern capturing comprises the action or module for identifying a first pattern in the layout at 204. In some embodiments, the action or module 204 comprises receiving a user's identification, selection, or creation of a pattern from within a layout editing module such as a commercial layout editor. For example, a user may identify the pattern by clicking on a particular pattern in the layout window or on a reference designator of a pattern in the layout editing module. In some embodiments, the pattern may be identified in accordance with, for example, a DRC (design rule checking) error marker, from simulation results, from certain model-based analytical results, or from results of a DFM (design for manufacturing) backend engine. More examples will be provided in subsequent paragraphs with reference to various figure(s). In some embodiments, the action or module 204 may also comprise an identification of a pattern from a database or other types of data structures of known good or known bad patterns that have been shown to respectively have positive and negatively impact on, for example, design for manufacturing, yield, or performance.

In some embodiments, the process or system for smart pattern capturing comprises the process or module for identifying or determining one or more key areas, zero or more don't-care areas, one or more space or empty areas (hereinafter space area), or a bounding box for the first pattern at 208. In some embodiments, a key area comprises the entire area that needs to be covered by geometries of a second pattern if the second pattern is considered to be a matched pattern of the first pattern. In some embodiments, a space area of the first pattern comprises the area that needs to be fully uncovered by the second pattern's geometries if the second pattern is determined to be a matched pattern of the first pattern. In some embodiments, a don't-care area comprises an area where the geometries of a second pattern that fall within this area do not affect the determination of whether or not the second pattern is considered a matched pattern of the first pattern. In other words, a don't-care area of the first pattern need not be completely covered or uncovered by the geometries or shapes of the second pattern in order for the second pattern to be considered as a matched pattern of the first pattern. In some embodiments, the process or module 208 comprises receiving a user's identification, selection, or creation of one or more key areas, one or more don't care areas, or more space areas, or a bounding box from within a layout editing module such as a commercial layout editor. For example, a user may create a key area by drawing a rectangle in the layout editing module.

In some embodiments, the process or system for smart pattern capturing comprises the process or module for invoking the analysis module at 210. In some embodiments, the process or system 210 comprises identifying one or more rule decks of one or more rules. In some embodiments, the one or more rules comprise a design rule. In some embodiments, a rule deck comprises a list of patterns that further includes stream file(s), layer definition(s), or filtering rule(s). The "stream file" and "layer definition" are all well-known term in OpenAccess®. A filtering rule is an additional filtering step that may be performed on the matched patterns. For example, a user may apply a recommend rule DRC check to the matched patterns to filter out only those matched patterns that fail this recommended rule. In another example, a user may specify a model-based check such as lithography analysis on the matched patterns to filter out only those patterns that are verified hotspots. In another example, a user may apply a second fuzzy match metric such as an area correlation to filter out only those patterns that are correlated to the match pattern. In some embodiments, a rule deck comprises a list of matching or fixing rules that takes, for example, one or more patterns or one or more layers as input.

The following illustrates an exemplary syntax for a rule deck in XML language.

```
<?xml version="1.0"?>
<MatchAndFixRules version="0.1">
<!-- Pattern definitions section -->
<!-- Match and fix rule definitions section -->
</MatchAndFixRules>
The following is an example of a pattern definition.
<!-- Single layer Pattern -->
<Pattern name="single_pattern1" version="v2">
   <Source type="oasis">
      <File name="pattern/ single_pattern1.oas" />
      <BBoxPurpose>5000</BBoxPurpose>
      <Purposes type="key">10</Purposes> <!-- Key
      Purpose -->
      <Purposes type="dc">50</Purposes> <!-- Don't
      care Purpose -->
```

```
        </Source>
        <Description>
            Necking Pattern 1
        </Description>
        <Severity>1</Severity>
        <FilteringRule type="CatenaDRC"
        name="minSpaceRule">
            <DRCRuleValue type="UserUnits">90
        nm</DRCRuleValue>
        </FilteringRule>
    </Pattern>
```

In the above example of a pattern definition, pattern name is mandatory, and the default value for version is 2. Pattern source name type is also mandatory, and pattern source may be either "oasis" or "gdsii". Source file name is mandatory. Bounding box purpose is mandatory. "Key" purpose is mandatory, but "Don't care" is optional. Detailed description, severity of the pattern, and filtering rule are optional. It shall be noted that in the above example, the filtering rule serves to filter out and return only matching regions that also fail a given rule. Exemplary filtering rules comprise minimum space rule, minimum notch rule, etc. Exemplary values for these filtering rules are based on recommended rules.

The following illustrates an exemplary multi-layer pattern definition.

```
<!—Multi Layer Pattern -->
<Pattern name="multi_pattern2" version="v2">
    <Source type="gdsii">
        <File name="pattern/ multi_pattern2.gds2"/>
        <BBoxPurpose>5000</BBoxPurpose>
        <PatternLayer name="custom_M02">
            <Purposes type="key">20</Purposes>
            <Purposes type="dc">50</Purposes>
        </PatternLayer>
        <PatternLayer name="custom_M03">
            <Purposes type="key">30</Purposes>
        </PatternLayer>
    </Source>
    <Description>
        Multi layer pattern 1
    </Description>
    <Severity>1</Severity>
    <FilteringRule type="CatenaDRC"
    name="minSpaceRule">
        <DRCRuleValue type="UserUnits">90
    nm</DRCRuleValue>
    </FilteringRule>
</Pattern>
```

The following illustrates an exemplary matching and fixing rule definition.

```
<MatchAndFixRule name="Match&Fix Rule 1 on M2">
    <MatchRule>
        <Pattern name=" singlepattern1" />
        <Layer>M2</Layer>
    </MatchRule>
    <FixRule name="moveEdges">
        <Move unit="nm">194 156 194 208 WEST
    130</Move>
    </FixRule>
    <FixRule name="fixFilteringRule" />
    <FixRule name="decongest">
        <Option name="ripupEngine">detail</Option>
    </FixRule>
</MatchAndFixRule>
```

The following illustrates an exemplary matching and fixing rule definition for a multi-layer pattern.

```
<MatchAndFixRule name="Multi-layer rule on M2-M3">
    <MatchRule>
        <Pattern name=" multi_pattern2" />
        <PatternLayerMap
        name="custom_M02">M2</PatternLayerMap>
        <PatternLayerMap
        name="custom_M03">M3</PatternLayerMap>
    </MatchRule>
</MatchAndFixRule>
```

In some embodiments, the process or system for smart pattern capturing comprises the process or module for determining whether or not various processes are to be multi-threaded at 212. In some embodiments, the process or module of 212 further comprises determining the number of threads to be used for various processes. In some embodiments, the process or system for smart pattern capturing comprises the process or module for searching the layout or the second set of layers or purposes of the layout for one or more matched or unmatched patterns of the first pattern at 214. In some embodiments, the process or module of identifying matched patterns comprises similar techniques as described in co-pending U.S. patent application Ser. No. 12/133,563 and U.S. patent application Ser. No. 11/609,901, now U.S. Pat. No. 7,818,707, both of which are hereby incorporated by reference in their entirety.

In some embodiments, the process or module 214 identifies unmatched patterns by first searching against the layout or against the second set of layers or purposes of the layout for matched patterns of the first pattern. The process or module then exclude these identified, matched pattern from consideration or from further consideration by other processes or modules. For example, in some embodiments where the first pattern constitutes a known good pattern, the process or module 214 may identify the matched patterns in the layout or in some layers of the layout and then exclude these identified, matched patterns from further consideration by, for example, a DFM backend engine that checks patterns to determine whether these patterns give rise to some DFM related issues.

In some embodiments, the process or system for smart pattern capturing comprises the process or module for optionally creating a new window for an interactive matched pattern browser at 216. The interactive matched pattern browser provides information and reference links for the identified, matched patterns for the user to quickly navigate among these matched patterns in some embodiments. In some embodiments, the interactive matched pattern browser comprises a graphical user interface which further comprises one or more groups of the identified, matched patterns. Each group may be expanded to show the corresponding matched patterns. A group may be formed based on the pattern orientation or the pattern type. Each identified, matched pattern may correspond to a reference link that causes the graphical display of the corresponding pattern to be displayed in a layout window when the reference link or the matched pattern is activated or clicked upon. The interactive matched pattern browser may also comprise a layout window that shows the pattern(s) of interest. FIGS. 8-15 illustrate an exemplary implementation of various processes or modules described herein and contain some exemplary implementation of the interactive matched pattern browser. The interactive matched pattern browser will be described in further details in subsequent paragraphs with reference to at least some of FIGS. 8-15.

In some embodiments, the process or system for smart pattern capturing comprises the process or module for invoking the action module to perform one or more processes at 218. In some embodiments, the one or more processes comprise grouping the identified, matched or unmatched patterns based at least in part upon the orientation of the identified patterns, upon the types of the identified patterns, upon the severity of the identified patterns, or upon the specific DFM failure(s). For example, the process or module at 218 may group identified patterns into the same group where each of the identified patterns to be grouped in the same group comprises the same geometric shapes but is in the same or a different orientation from others or is a mirror image of another. As another example, the process or module at 218 may also group identified patterns in the same group if these identified patterns are not entirely identical, but their differences in the geometric shapes fall within the don't-care areas of the first pattern.

In some embodiments, the one or more processes comprise performing verification of the underlying electronic circuit design by examining one or several instances of the first pattern or the identified, matched patterns. In some embodiments, the one or more processes comprise performing layout compaction based at least upon the identified patterns. In some embodiments, the one or more processes comprise performing a pattern classification to group patterns based on metrics such as area correlation or edge registration. One example of this type of classification is described in U.S. patent application Ser. No. 12/241,409, now U.S. Pat. No. 8,079,005, the contents of which are incorporated by reference in their entirety. In some embodiments, the one or more processes comprise identifying the nets related to the matched patterns and grouping of matched patterns by shared circuit nets.

In some embodiments, the process or system for smart pattern capturing comprises the process or module for invoking the post-action module to perform one or more processes at 220. In some embodiments, the one or more processes comprise generating a graphical or textual representation of the identified, matched patterns for review.

Figure 3:
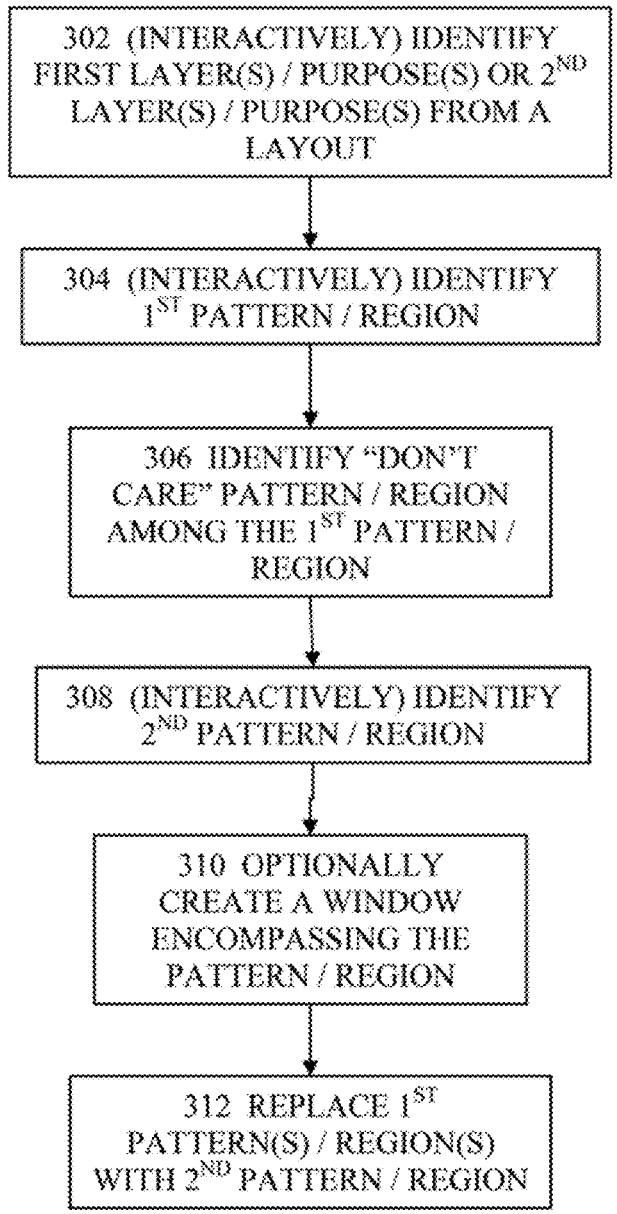
FIG. 3 illustrates a high level flow diagram for a process or a system for pattern replacement in an electronic circuit layout in some embodiments.

Referring to FIG. 3 which illustrates a high level flow diagram for a process or a system for pattern replacement in an electronic circuit layout in some embodiments. In some embodiments, the process or system for pattern replacement comprises the act or module of identifying a first set of layers or purposes or a second set of layers or purposes from within a layout at 302. In these embodiments, the first set of layers comprises one or more layers that will be searched against to identify one or more matched patterns. In some embodiments, the second set of layers or purposes is used to identify a pattern of interest that may be used to identify other matched patterns in the layout. In various embodiments, a layer denotes a layer in a semiconductor film stack.

For example, a layer may refer to metal-1, a poly-silicon layer, a metal-5 layer, etc. A modern semiconductor film stack often comprises more than 20 layers, each of which may be designated or identified by the processes or systems as described in various embodiments of the Specification. It shall also be noted that a router or a routing engine does not usually operate upon or use the metal-1 layer or a poly-silicon layer. Nonetheless, the processes or systems described herein may also apply to the metal-1 and poly-silicon layers.

In some embodiments, a purpose comprises a single data type of a layer. A layer may comprise multiple purposes or multiple data types in some embodiments. In some embodiments, a purpose does not correspond to more than one layer. In some embodiments, the process or action 302 comprises receiving a user's interactive selection or identification of the first set of layers or the second set of layers by, for example, interactively clicking on one or more visible layers in the user interface or graphical user interface.

In some embodiments, the process or system for pattern replacement comprises the act or module of identifying a first pattern from within a layout of an electronic circuit design at 304. In some embodiments, the action or module 304 comprises receiving a user's identification or selection of a pattern from within a layout editing module such as a commercial layout editor. For example, a user may identify the pattern by clicking on a particular pattern in the layout window or on a reference designator of a pattern in the layout editing module. In some embodiments, the pattern may be identified in accordance with, for example, a DRC (design rule checking) error marker, from simulation results, from certain model-based analytical results, or from results of a DFM (design for manufacturing) backend engine. More examples will be provided in subsequent paragraphs with reference to various figure(s). In some embodiments, the action or module 304 may also comprise an identification of a pattern from a database or other types of data structures of known good or known bad patterns that have been shown to respectively have positive and negatively impact on design for, for example, design for manufacturing, yield, or performance.

In some embodiments, the process or system for pattern replacement comprises the act or module of identifying one or more don't-care areas, one or more key areas, or one or more space areas for the first pattern at 306.

In some embodiments, the process or system for pattern replacement comprises the act or module of identifying one or more second patterns that may be used to replace the first pattern at 308. In some embodiments, the one or more second patterns may be identified by receiving user's input from a user interface or a graphical user interface. For example, the user may identify a pattern which may cause some problems with yield or other aspects of the electronic circuit design. The user may initiate some fixing processes to correct the original pattern. After the fixing processes, the pattern is determined to be good by, for example, the DFM backend engine, a DRC engine, a simulation engine, etc. Then, the process or module at 308 may identify this "fixed" pattern as the second pattern. In some embodiments, the one or more second patterns may be identified from a database or other types of data structures of patterns that are known to be good in terms of, for example, design for manufacturing, yield, performance, etc. In some embodiment, the one or more second patterns are decomposed into two or more additional layers that have been verified for manufacturability for the purposes of performing a double-patterning layer decomposition.

Figure 8:
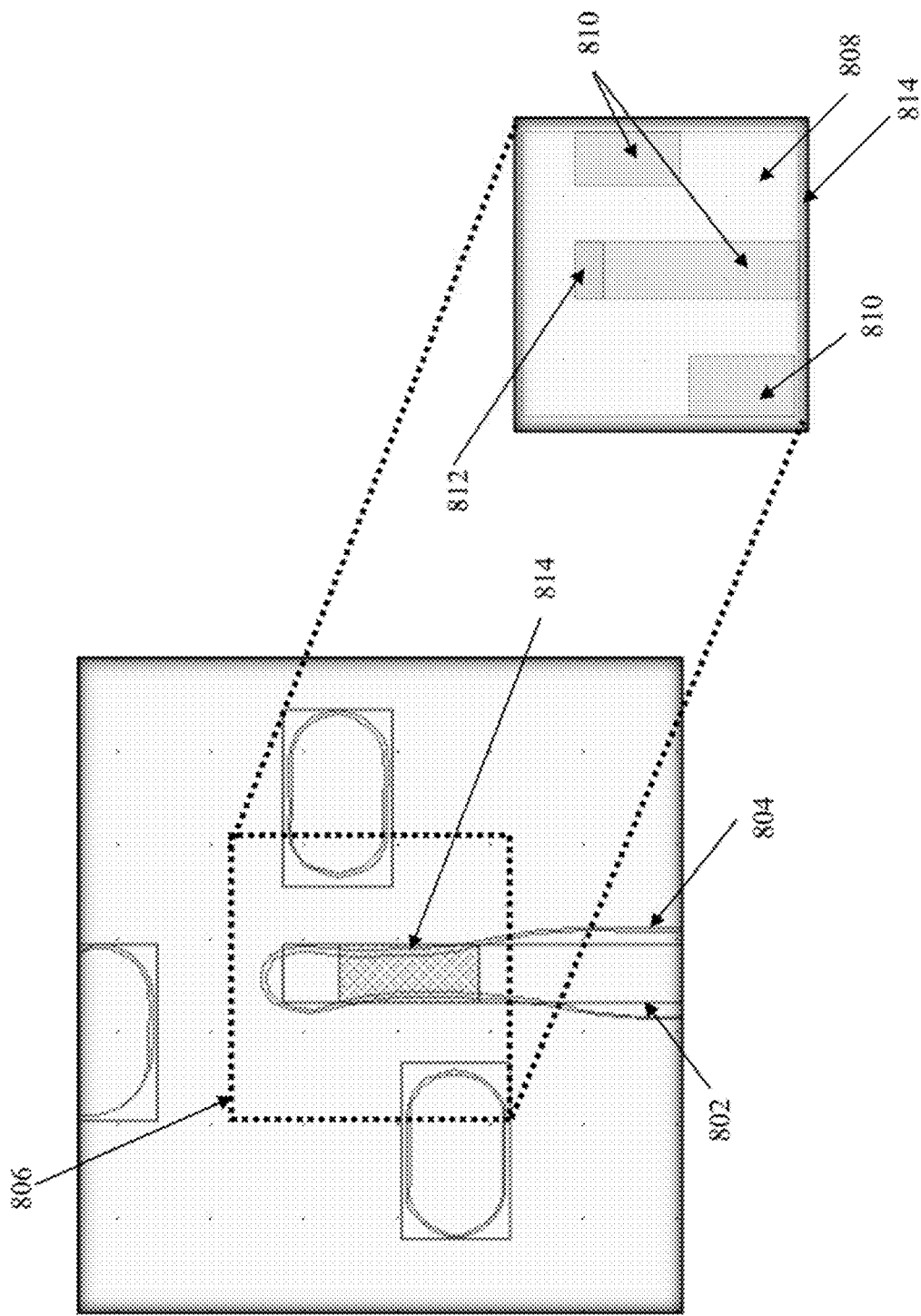
FIG. 8 illustrates an exemplary portion of a layout and an exemplary pattern that is to be referenced by various processes or modules described in this Specification.

Moreover, after the don't-care area for the first pattern has been identified, the process or module at 308 may modify the geometries of the first pattern and invoke the pattern analyzer, such as a DRC engine or a DFM backend engine, to identify the second pattern in some embodiments. For example, the area 812 in FIG. 8 illustrates a don't-care area for the pattern as defined by the bounding box 814 of the first pattern. Assuming the first pattern may result in some negative impact on yield such as the necking problem as illustrated by the printed or simulated geometry 804, the process or module at 308 may exploit the don't-care area 812 to see if modifying the line end of the middle key area 810 by stretching it to a point just outside the don't-care area 812 may resolve the necking problem. If the process or module determines that stretching the line end of the middle key area 810 successfully solves the necking problem, the process or module at 308 may identify this new pattern as the second pattern for the original pattern. In another example, the separation between the key areas 810 may be increased to resolve the necking problem. In another embodiment, the process or module at 308 may modify the geometries of the first pattern within the confine of the don't-care area. For example, in a good pattern flow, the don't care area captures a family of possible geometry movements that are good.

In some embodiments, the process or module at 308 may identify the second pattern from a database or other types of data structures that store patterns that are known to be good in terms of, for example, DFM, DRC, yield, etc. by determining whether there exists any pattern that differs from the first pattern, and that the difference between the first pattern and the second pattern lies completely within the don't-care area of the original, first pattern. If the process or module at 308 identifies such a pattern from the database or data structure that is known to be good, the process or module at 308 may identify such a pattern as the second pattern.

In some embodiments, the process or module at 308 may identify a plurality of second patterns where at most one of the plurality of second patterns may be used to replace the first pattern. More details about which second pattern will be selected or identified to replace the first pattern will be described in greater details in subsequent paragraphs with reference to one or more figures. In some embodiments, the process or module at 308 may choose different second patterns to replace the first pattern at different locations by taking the context information including the neighboring geometries within a certain range of the respective first pattern into consideration.

In some embodiments, the process or system for pattern replacement comprises the act or module of optionally creating a new window for an interactive matched pattern browser at 310. In some embodiments, the process or system for pattern replacement comprises the act or module of replacing the first pattern with the second pattern at 312.

Figure 4:
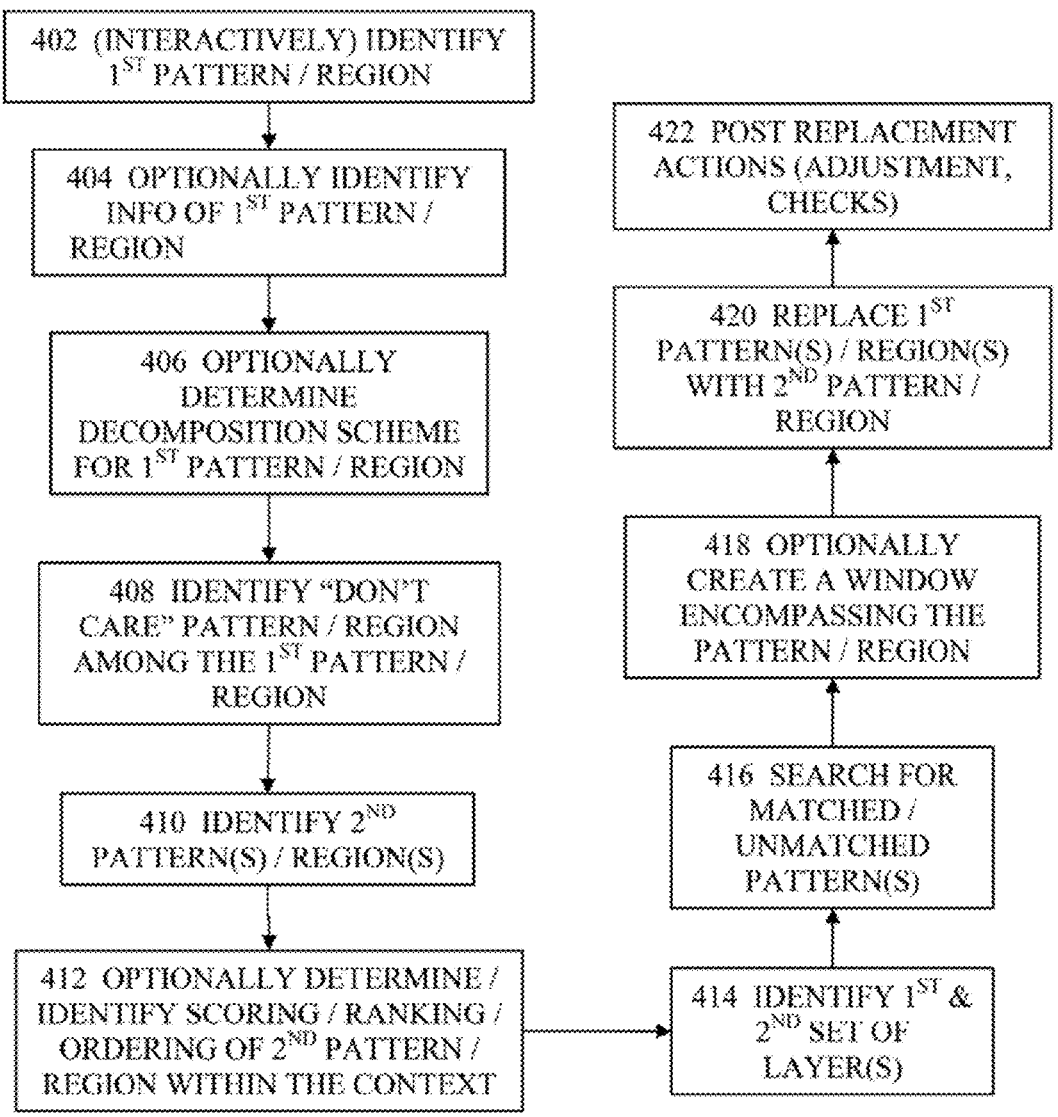
FIG. 4 illustrates more details of a high level process flow diagram for a process or a system for pattern replacement from within an electronic circuit layout in some embodiments.

Referring to FIG. 4 which illustrates more details of a high level process flow diagram for a process or a system for pattern replacement from within an electronic circuit layout in some embodiments. In some embodiments, the process or system for pattern replacement comprises the act or module of identifying a first pattern that is to be replaced at 402. In some embodiments, the process or system for pattern replacement comprises the act or module of identifying information or data relating to the first pattern at 404.

In some embodiments, various processes or modules use at least the information or data relating to the first pattern to ensure the correctness of the design when the first pattern is replaced by the second pattern. In some embodiments, the information or data relating to the first pattern comprises, for example, the connectivity information or data or information concerning DFM or verification of the first pattern that identifies the connections between the components within the first pattern to other components within or outside the first pattern. In various embodiments, the information or data relating to the first pattern may be used to ensure or improve the correctness of the design during the pattern capturing process or the pattern fixing process. For example, the information or data relating to the first pattern such as the connectivity information may be used to ensure or improve the correctness of the electronic circuit design when various processes or modules determines the replacement pattern to replace the first pattern or matched patterns thereof. As another example, the information or data relating to the first pattern such as the connectivity information may also be used to ensure or improve the correctness of the fixing process(es) by various processes or modules when these processes or modules are moving, modifying, decomposing, replacing, or removing various geometries in the layout.

In various embodiments, the information or data relating to the first pattern may also be used to ensure or improve the cleanliness of the design layout. For example, various processes or modules may be made aware of the information or data relating to the first patter such as the information or data concerning the cleanliness requirements in terms of DFM or DRC such that these processes or modules do not introduce, for example, new DFM or DRC violations or issues during their manipulation of the layout to perform the processes described herein.

In some embodiments, the information or data relating to the first pattern may comprise information or data of various hard or recommended rules, constraints, etc. In various embodiments, a hard rule represents a rule that must be satisfied in the layout, and a recommended rule or a soft rule represents a rule that is generally more conservative and may not always be satisfied throughout the entire layout. An exemplary hard rule may state that the minimum spacing between adjacent wires is 100 nm. An exemplary recommended rule may allocate, for example, an additional 20 nm spacing for a more conservative new minimum spacing between adjacent wires of 120 nm. In some embodiments during the pattern replacement process or during other processes as described in various other embodiments, the processes or modules apply the recommended rules over the hard rules. One advantage for this choice of recommended rules over the hard rules is that the first pattern that needs to be replaced or fixed may constitute what is generally known as a hot spot, and thus more conservative rules may benefit the design by, for example, improving the yield or manufacturability of the design due to their more conservative requirements.

In some embodiments, the process or system for pattern replacement comprises the act or module of optionally determining one or more decomposition scheme for the first pattern that decomposes the first patter into a plurality of sub-patterns that belong to a plurality of layers at 406. In these embodiments, the process or module may determine how to decompose the first pattern into, for example, two sub-patterns, and in which layer each of the two sub-patterns is to be placed. In some embodiments, the process or module determines the decomposition scheme for double patterning.

In some embodiments, the process or system for pattern replacement comprises the act or module of identifying one or more don't-care areas, one or more key areas, or one or more space areas for the first pattern at 406. In some embodiments, the process or system for pattern replacement comprises the act or module of identifying one or more second patterns that may be used to replace the first pattern at 408.

In some embodiments where a plurality of second patterns are identified at 410, the process or system for pattern replacement comprises the act or module of optionally determining or identifying the scoring, ranking, or ordering of the plurality of second patterns. In some embodiments, the process or system determines or identifies the scoring, ranking, or ordering of the plurality of second patterns within the context of the first pattern that is to be replaced by one of the plurality of second patterns. In some embodiments, the plurality of second patterns may be previously ranked, scored, or ordered within a plurality of contexts or environments that each of the plurality of second patterns is situated according to, for example, some statistical analysis processes based at least in part on some actual manufacturing data or test pattern wafer data, heuristics, simulation results, etc. For example, a second pattern that is placed near certain surrounding geometries may be associated with a certain rank, score, or order by examining its effects on yield, performance, etc. Such a certain rank, score, or order may then be persisted in a database or other types of data structures for the second pattern while providing a link between the second pattern and the information or data of its respective context or environment. Then the process or module at 412 may retrieve the second pattern with reference to the context that most resembles the context of the first pattern to be replaced, and the score, rank, or order of the second pattern may be referenced by the process or module at 412.

In some embodiments, the process or system at 412 may determine or identify the scoring, ranking, or ordering of the plurality of second patterns by invoking other processes or modules to analyze at least one of the plurality of second patterns within the context or environment of the first pattern that the second pattern is to replace by performing, for example, simulation, a model-based analysis, or a rule-based analysis, to determine the scoring, ranking, or order of the second pattern. For example, the process or module may examine the surrounding geometries of the first pattern and analyze the interaction between these surrounding geometries and a particular second pattern if the particular second pattern is to replace the first pattern by using, for example, simulation, rule-based analyses, or model-based analyses to determine, for example, the impact of the particular second pattern on yield, performance, etc. so as to determine the scoring, ranking, or ordering of the particular second pattern.

In some embodiments, the process or system for pattern replacement comprises the act or module of identifying a first set of layers or purposes or a second set of layers or purposes at 414. In some embodiments, the first set of layers or purposes represents the layers or purposes against which a search will be performed to identify patterns that match or does not match the first pattern. In some embodiments, the second set of layers or purposes represents the layers or purposes that the first pattern is to be identified.

In some embodiments, the process or system for pattern replacement comprises the act or module of searching for one or more patterns in the layout or in the identified layers or purposes of the layout that match or do not match the first pattern at 416. In some embodiments, the process or system for pattern replacement comprises the act or module of optionally creating a new window for the interactive matched or unmatched pattern browser to present information or data of the matched or unmatched patterns at 418. In some embodiments, the process or model does not create a new window for the interactive matched or unmatched pattern browser but uses, for example, the existing layout window for similar purposes. The interactive matched or unmatched pattern browser will be described in more details in subsequent paragraphs with reference to one or more figures.

In some embodiments, the process or system for pattern replacement comprises the act or module of replacing the first pattern with a second pattern at 420. In some embodiments, the process or system for pattern replacement comprises the act or module of performing one or more post-replacement actions at 422. In some embodiments, the process or system at 422 may invoke various modules to check the corresponding portion of the layout for DFM cleanliness, DRC cleanliness, yield, performance, optimization, etc. after the second pattern has replaced the original first pattern. In some embodiments, the process or system at 422 may further examine the post-replacement layout portion to determine whether further optimization may be achieved. For example, the process or the system at 422 may move or modify geometries in the corresponding portion of the layout near the second pattern to further improve or optimize the layout.

Figure 5:
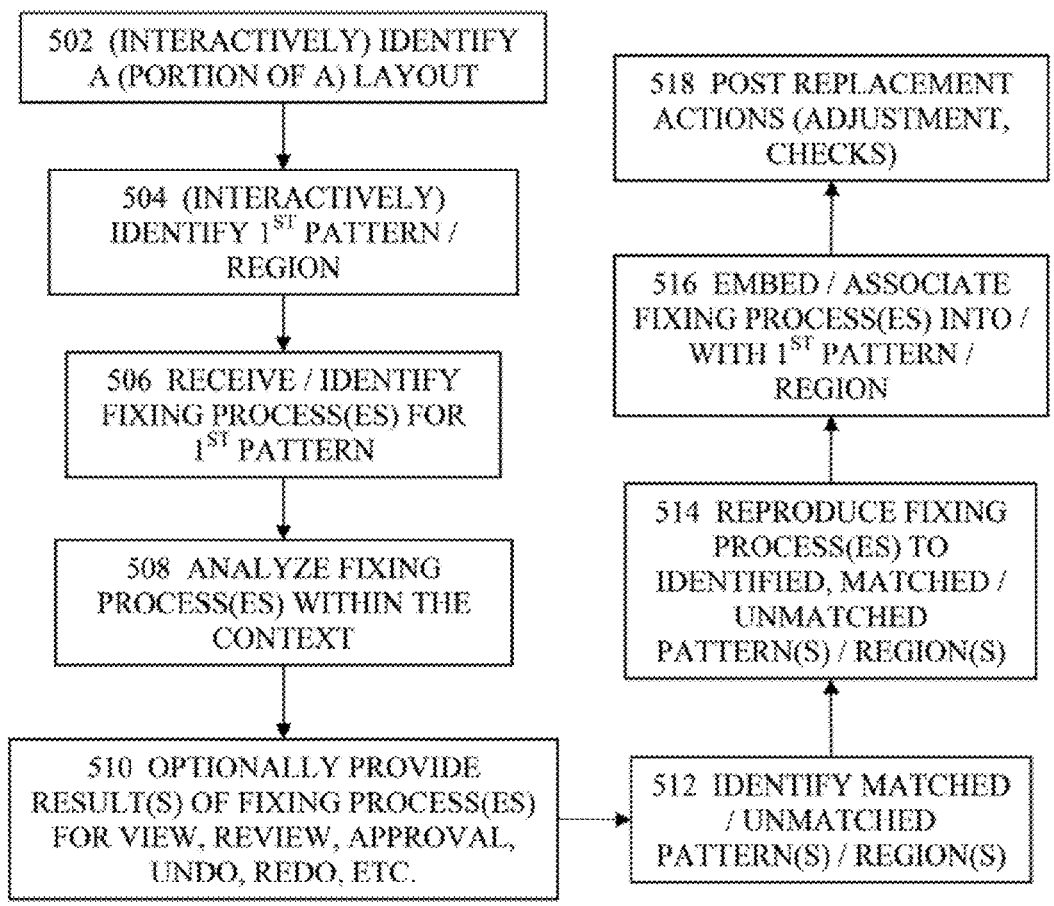
FIG. 5 illustrates a top level diagram for a process or system for interactively describing fixing processes for an electronic circuit layout in some embodiments.

Referring to FIG. 5 which illustrates a top level diagram for a process or system for interactively describing fixing processes for an electronic circuit layout in some embodiments. In some embodiments, the process or system for interactively describing fixing processes for an electronic circuit layout comprises the act or module of identifying a layout of an electronic circuit design or a portion thereof at 502. In some embodiments, the process or module at 502 may interactively identify the layout or a portion thereof by receiving an input from a user who interactively identifies the layout or a portion thereof from the user interface or graphical user interface. In some embodiments, the process or system for interactively describing fixing processes for an electronic circuit layout comprises the act or module of identifying a first pattern from within the layout or a portion thereof at 504. In some embodiments, the process or module at 504 may interactively identify the first pattern by receiving an input from a user who interactively identifies the first pattern from the user interface or graphical user interface.

In some embodiments, the process or system for interactively describing fixing processes for an electronic circuit layout comprises the process or module of receiving or identifying one or more fixing processes for the first pattern at 506. In some embodiments where the user performs the one or more fixing processes through the use of the user interface by either specifying a fixing process or by invoking various modules or processes to perform a fixing process, the process or module of receiving or identifying one or more fixing processes at 506 may comprise using one or more macros, one or more log records, or other similar techniques to record the one or more fixing processes. In some embodiments where at least some of the one or more fixing processes are embedded in or associated (hereinafter associated) with the first pattern, the process or module at 506 may identify such at least some of the one or more fixing processes that are embedded in or associated with the first pattern. In some embodiments, the process or system allows the user to manually override a part of the one or more fixing process. In some embodiments, the process or system also allows the user to enter his or her script for fixing the first pattern.

In some embodiments, the process or system for interactively describing fixing processes for an electronic circuit layout comprises the act or module of analyzing the one or more fixing processes within the context or environment (hereinafter context) of the first pattern at 508. For example, the process or module at 508 may analyze the first pattern in view of its surrounding geometries within a certain radius or distance after the one or more fixing processes are applied to determine the effects of the one or more fixing processes on, for example, the yield, performance, manufacturability, functionality, etc. of the electronic circuit design layout or a portion thereof.

In some embodiments, the process or system for interactively describing fixing processes for an electronic circuit layout comprises the act or module of optionally presenting the results of the one or more fixing processes to a user via a user interface or a graphical user interface so that the user may view, review, approve, or disapprove one or more of the fixing processes at 510. In some embodiments, the one or more fixing processes are not yet applied to the first pattern at 510, and results presented by the process or module at 510 constitute what the actual or approximate results may appear if the one or more fixing processes are actually applied to the first pattern. It shall be noted that in these embodiments, the presented results may be approximate because certain optimization processes may not yet be performed so as to save system resources on multiple candidate fixing processes while only one or some of them may actually be applied to fix the first pattern.

In some embodiments, the one or more fixing processes are automatically applied to the first pattern prior to 510, and thus the results presented at 510 constitute the actual results of the one or more fixing processes. In these embodiments, the process or system at 510 may also provide the options of undo some or all of the one or more fixing processes, redo some or all of the one or more fixing processes, etc.

In some embodiments, the process or system for interactively describing fixing processes for an electronic circuit layout comprises the act or module of identifying patterns that match or do not match the first pattern at 512. In these embodiments, the process or module at 512 may apply the processes or invoke the modules that are described above with reference to FIG. 2 to identify such patterns that match or do not match the first pattern. In some embodiments, the process or system for interactively describing fixing processes for an electronic circuit layout comprises the act or module of reproducing the one or more fixing processes to the identified matched or unmatched patterns at 514. For example, the process or system may identify that there exist another 27 occurrences of patterns that match the first pattern identified at 504. The process or system at 514 may then reproduce the one or more fixing processes, which have been applied to the first pattern, to these 27 occurrences of patterns that match the first pattern.

In some embodiments, the process or system for interactively describing fixing processes for an electronic circuit layout comprises the act or module of embedding the one or more fixing processes into or associating the one or more fixing processes with the first pattern at 516. For example, the process or system may provide a reference link between the first pattern and one or more fixing processes, such as some fix rules, constraints, or macros, so the fixing processes may be identified for the first pattern if the first pattern is reused in the future. In some embodiments, the process or system may also comprise the act or module of performing one or more post-replacement actions at 518 as previously described in some of the preceding paragraphs with reference to FIG. 4.

Figure 6:
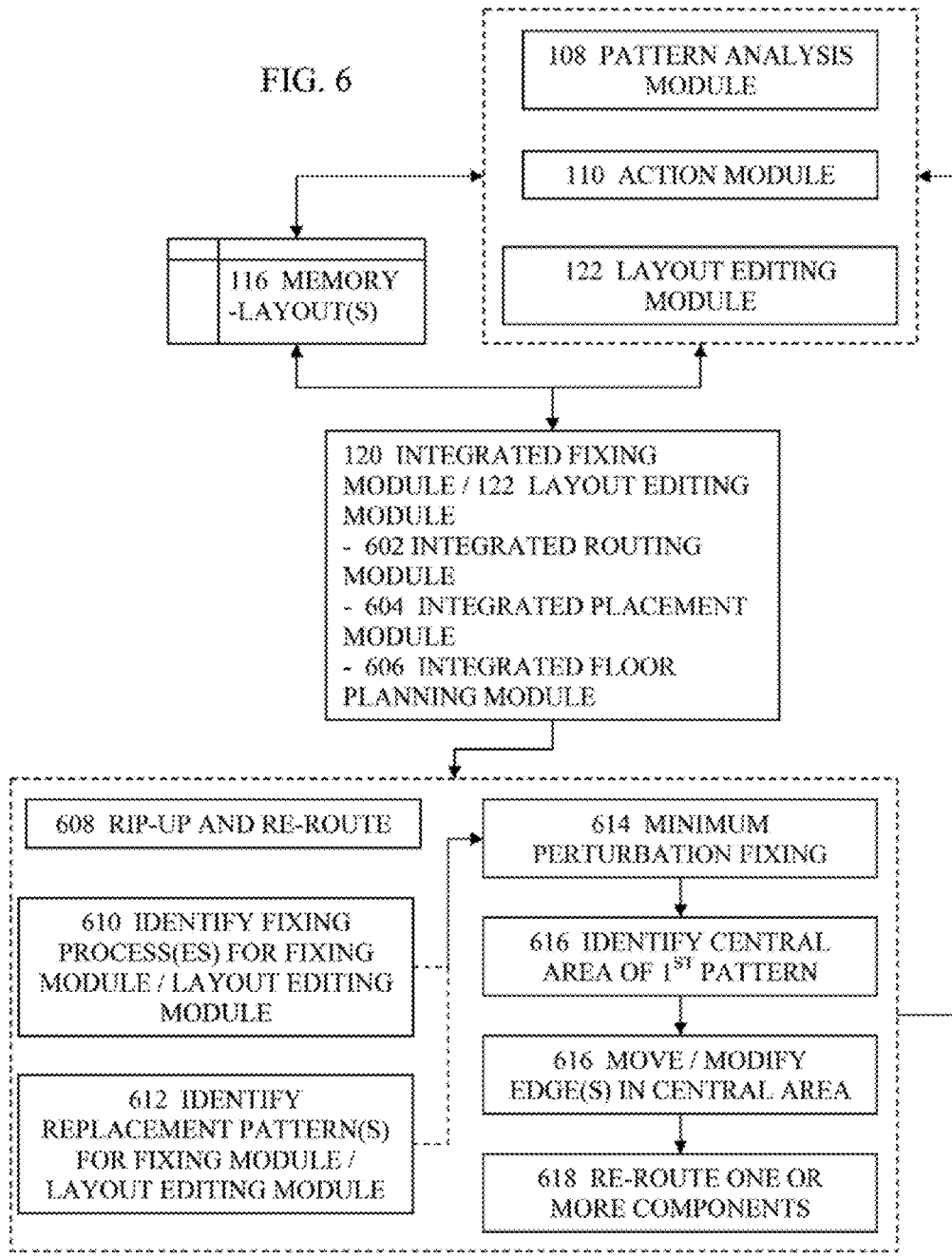
FIG. 6 illustrates a high level flow diagram of a process or a system for interactively identifying and fixing DFM issues of an electronic circuit design layout in some embodiments.

Referring to FIG. 6 which illustrates a high level flow diagram of a process or a system for interactively identifying and fixing DFM issues of an electronic circuit design layout in some embodiments. In some embodiments, the process or system for interactively identifying and fixing DFM issues of an electronic circuit design layout comprises the integrated fixing module 120 (if the integrated fixing module 120 is a separate module from module 122) or the layout editing module 122 (if the integrated fixing module 120 is integrated within the layout editing module). Throughout the specification, the process or module will be called the integrated fixing module with the reference numeral 120 for simplicity.

The integrated fixing module 122 interacts with various other modules, such as the pattern analysis module 108, the action module 110, or the layout editing module 122, and accesses the non-transitory computer readable storage medium 116 to read in or write to one or more layouts. The integrated fixing module comprises one or more of an integrated routing module 602 that performs various processes or functions of a router, an integrated placement module 604 that performs various processes or functions of a placement tool, and an integrated floor planning module 606 that performs some or all of the processes or functions of a placement and route tool together with the processes or functions of floor-planning.

In some embodiments, the integrated fixing process or module 120 is configured for performing various processes to fix an electronic circuit design layout. In some embodiments, the various processes comprise the act of identifying one or more fixing processes at 610 as described above with reference to FIG. 5. In some embodiments, the various processes may directly perform the one or more fixing processes to fix the layout at 610.

In some embodiments, the various processes comprise the act of identifying one or more replacement patterns for a pattern to be replaced at 612 as described above with reference to FIGS. 3-4. In some of these embodiments, the various processes may directly replace the pattern with at least one of the one or more replacement patterns.

The various processes may also comprise performing a minimum perturbation fixing process at 614 which comprises the act of identifying a central area of the first pattern to be fixed at 616 in some embodiments. The minimum perturbation fixing process 614 may further comprise the act of moving or modifying one or more edges or geometries within the central area of the first pattern in some embodiments. In some embodiments where there exist no more edges or geometries to move or modify to successfully fix the first pattern, the various processes may further comprise re-route one or more components or one or more segments of a component. The various processes may also comprise the rip-up and re-route process to fix the pattern or the layout. In these embodiments, the central area of a pattern is identified or determined by determining an area where certain percentage of violations has been previously identified for this particular pattern or other similar patterns by using, for example, statistical analysis, probabilistic analysis, simulation, or certain rule-based or model-based approaches. For example, if it is determined that 95% of violations occur within a certain distance or a certain radius from the center of a pattern, the integrated fixing module 120 may first start by moving or modifying edges or geometries closer to the center within the central area while invoking various processes or modules to examine whether the violations have been fixed by moving or modifying these edges or geometries. The various processes may also comprise using a layout compactor as part of the layout editing module to resolve any DRC violations that are introduced during pattern fixing or pattern replacement.

Figure 7:
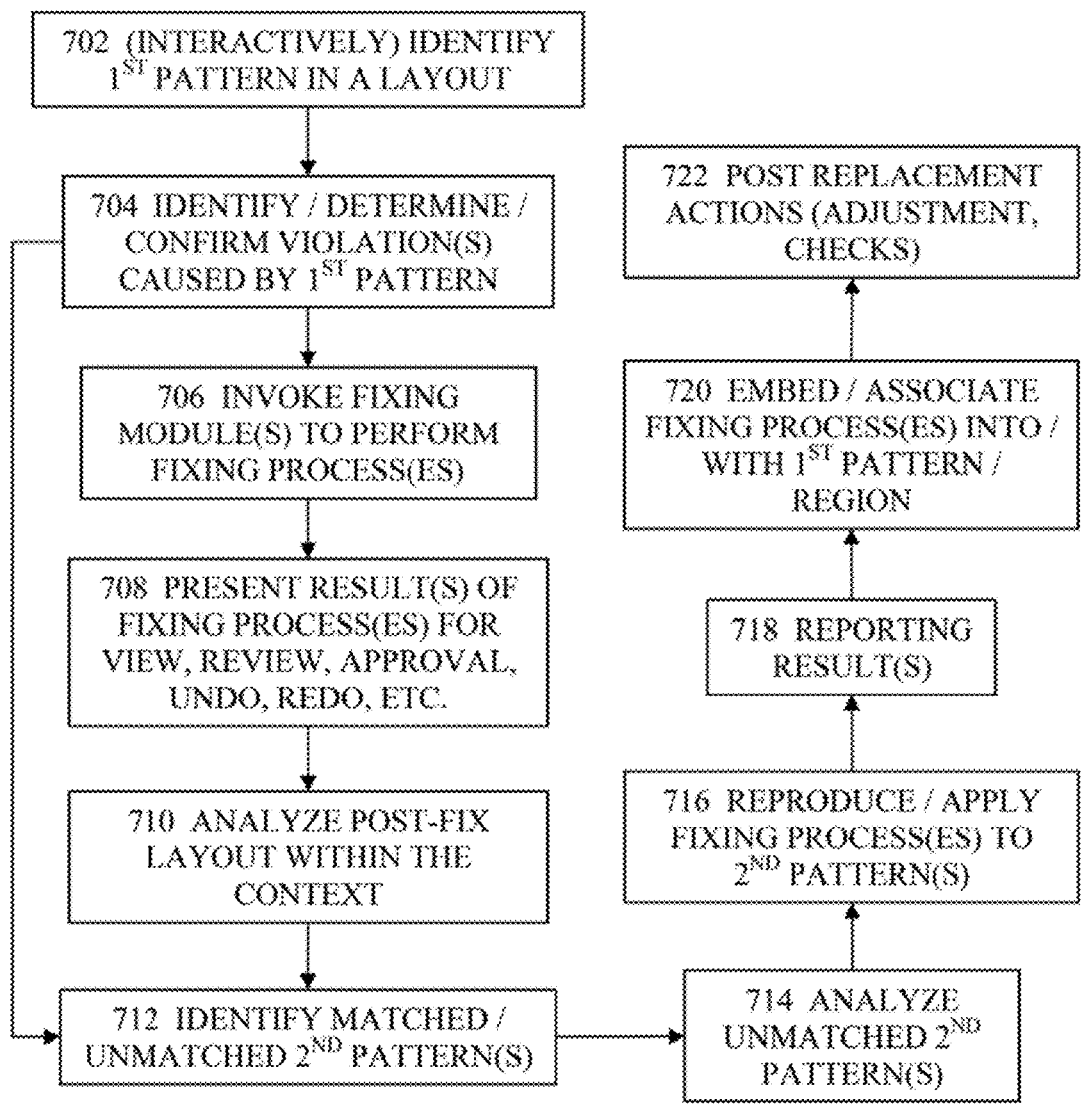
FIG. 7 illustrates a high level flow diagram for a process or system for interactively identifying and fixing DFM issues of an electronic circuit design layout using a layout editing module in some embodiments.

Referring to FIG. 7 which illustrates a high level flow diagram for a process or system for interactively identifying and fixing DFM issues of an electronic circuit design layout using a layout editing module in some embodiments. In some embodiments, the process or system for interactively identifying and fixing DFM issues of an electronic circuit design layout using a layout editing module comprises the act or module of identifying a first pattern from within a layout at 702. In some embodiments, the process or module at 702 identifies the first pattern by receiving a user's interactive selection or designation of a pattern in the user interface or graphical user interface.

In some embodiments, the process or system for interactively identifying and fixing DFM issues of an electronic circuit design layout using a layout editing module comprises the act or module of identifying or determining or confirming the DFM violation or issue that is caused by the first pattern at 704. In some embodiments, the identification, determination, or confirmation of such a DFM violation or issue may be performed by using the intrinsic capabilities of the layout editing module such as the simulation, verification, etc. In some embodiments, the identification, determination, or confirmation of such a DFM violation or issue may be performed by invoking various processes or modules such as a DRC engine, a DFM backend engine, etc. In some embodiments where the process or module at 704 finds no DFM violations with respect to the first pattern, the process or module 704 proceeds to 712, which will be described later in subsequent paragraphs.

In some embodiments where the process or system identifies, determines, or confirms that the first pattern gives rise to a violation or issue, the process or system may further comprise the act or module of invoking the integrated fixing module to perform one or more fixing processes at 706 as described in the preceding paragraphs with reference to FIGS. 2-6. In some embodiments, the process or system for interactively identifying and fixing DFM issues of an electronic circuit design layout using a layout editing module comprises the act or module of presenting results of the one or more fixing processes in an interactive matched pattern browser for the user to view, review, approve, disapprove, undo, or redo some or all of the one or more fixing processes at 708 as described in some of the preceding paragraphs with reference to FIGS. 2-5.

In some embodiments, the process or system for interactively identifying and fixing DEM issues of an electronic circuit design layout using a layout editing module comprises the act or module of analyzing the post-fix layout or a portion thereof within the context of the first pattern to which the one or more fixing processes apply at 710 as previously described in some of the preceding paragraphs with reference to FIGS. 4-6.

In some embodiments, the process or system for interactively identifying and fixing DFM issues of an electronic circuit design layout using a layout editing module comprises the act or module of identifying one or more patterns that match or do not match the first pattern at 712 as previously described in some of the preceding paragraphs with reference to FIGS. 2-5. In some embodiments where the first pattern is determined to give rise to some violations or issues in terms of yield, performance, functionality, etc., the process or the system at 714 identifies patterns in the layout or a portion thereof that match the first pattern so the process or the system may fix these matched patterns. In some embodiments where the first pattern is determined not to give rise to any violations or issues, the process or system may identify the unmatched patterns which represent patterns that have not been determined to be, for example, DFM clean or DRC clean. In some embodiments, the process or system may identify matched patterns first and then exclude the matched patterns from further consideration by various processes or modules as described in various embodiments herein or by other processes or modules such as certain DFM backend engines in order to conserve system resources on patterns that are known to be good and to more efficiently conclude the design process within a shorter period of time.

In some embodiments, the process or system for interactively identifying and fixing DFM issues of an electronic circuit design layout using a layout editing module comprises the act or module of analyzing the unmatched second pattern to determine whether the unmatched pattern may give rise to some violations or issues at 714 by using a process or invoking a module similar to that as described at 704.

In some embodiments where the unmatched pattern or where the first pattern is determined to give rise to some violations or issues, the process or system for interactively identifying and fixing DFM issues of an electronic circuit design layout using a layout editing module comprises the act or module of reproducing or applying one or more fixing processes to the second pattern at 716. In the embodiments where the first pattern is determined to give rise to some violations or issues, the process or module at 716 applies the one or more fixing processes to the second matched patterns.

In the embodiments where the first pattern is determined to be good, the process or module at 716 may identify fixing processes associated with or embedded in the second unmatched pattern and then perform the associated or embedded fixing processes to the second unmatched pattern. In some embodiments where no fixing process is embedded into or associated with the second unmatched pattern, the process or module may invoke various modules such as those described with reference to FIG. 6.

In some embodiments where no fixing process is embedded into or associated with the second unmatched pattern, the process or module may invoke various modules such as a simulation engine, a model-based analytical process or module, a rule-based analytical process or module, an artificial intelligence process or module such as a learning process or a learning module, a knowledge base engineering process or module, or an expert assessment system to examine the second pattern and its surrounding geometries in order to determine the proper fixing processes for the second unmatched pattern.

In some embodiments, the process or system for interactively identifying and fixing DFM issues of an electronic circuit design layout using a layout editing module comprises the act or module of presenting results of applying the fixing process(es) to the second pattern at 718 as described with reference to item numeral 708 above. At 720, the process or the system may further embed the fixing process(es) into or associate the fixing process(es) with the second pattern. In some embodiments, the process or system for interactively identifying and fixing DFM issues of an electronic circuit design layout using a layout editing module comprises the act or module of performing one or more post-replacement actions at 722 as previously described in some of the preceding paragraphs with reference to FIGS. 4-5.

FIG. 8 illustrates an exemplary portion of a layout and an exemplary pattern that is to be referenced by various processes or modules described in this Specification. The left hand portion of FIG. 8 illustrates an exemplary portion of a layout where the straight line segments such as 802 represent the as-drawn geometries, and the curvilinear segments such as 804 represent the simulated or actually printed images of the as-drawn geometries. Item numeral 806 represents an identification of a first pattern, which may be done by, for example, a user clicking on and dragging a pointing device in a layout widow of a layout editing module such as a layout editor. The first pattern is then identified as enclosed by the bounding box 814 which encompasses the key areas 810, the don't-care area 812, and the space area 808 that may be identified according to various processes or modules as described above. It can be seen from FIG. 8 that this first pattern causes a necking issue in the area 814 along the vertical component in the layout.

Figure 9:
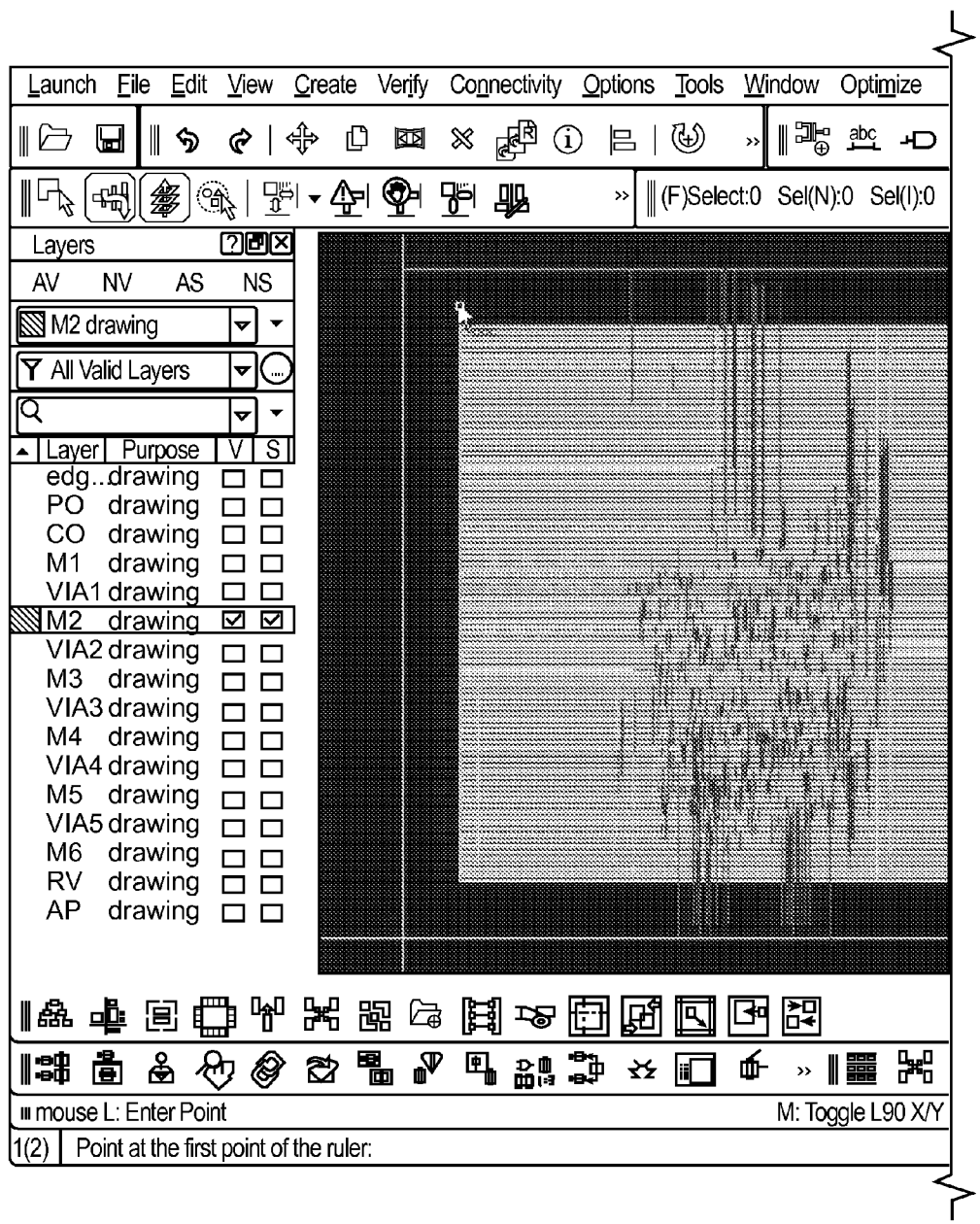
FIG. 9 illustrates a graphical user interface (GUI) showing a layout or a portion of a layout of an electronic circuit design that implements various embodiments as described in the preceding paragraphs.
Figure 9:
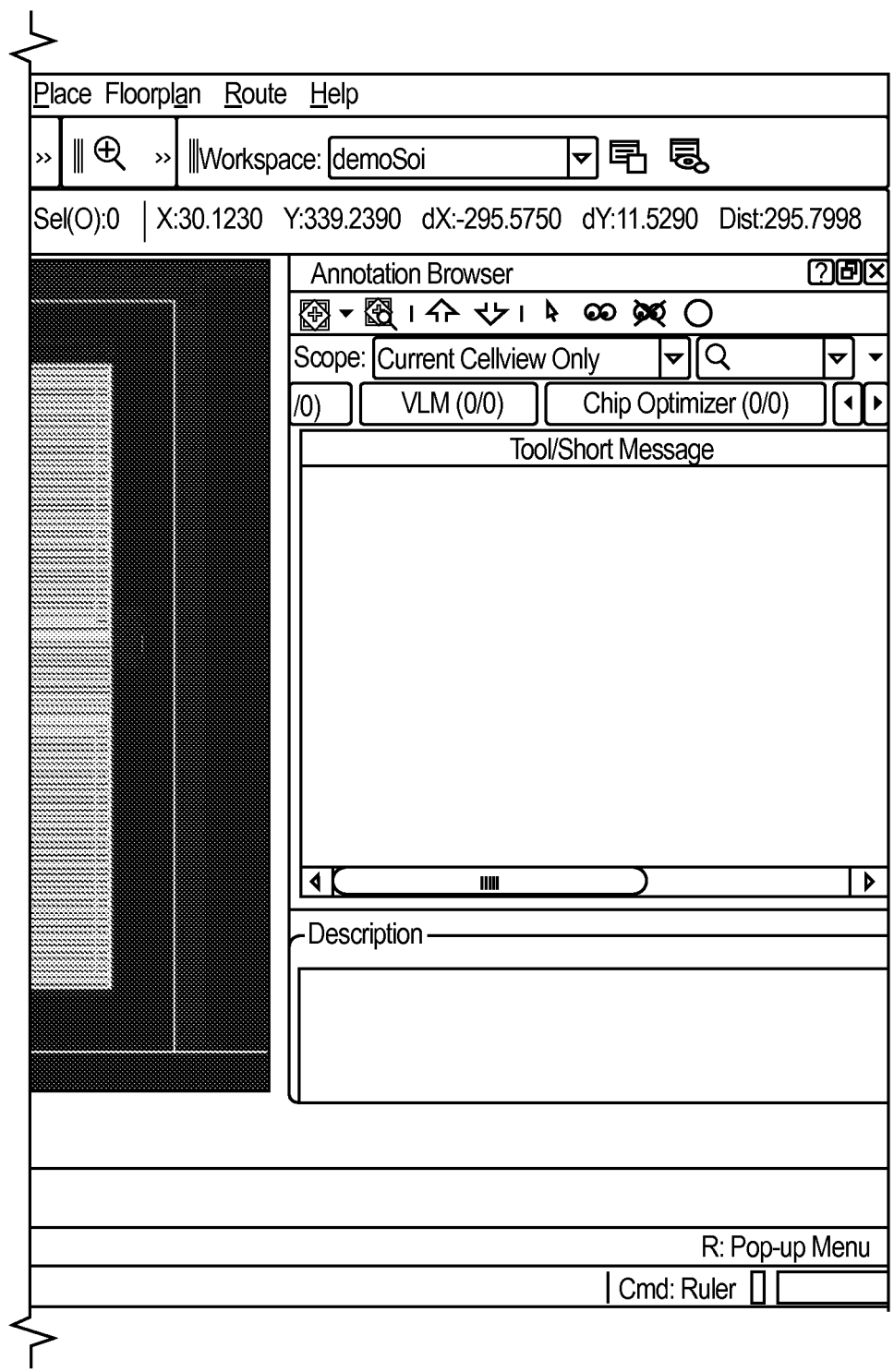

FIG. 9 illustrates a graphical user interface (GUI) showing a layout or a portion of a layout of an electronic circuit design that implements various embodiments as described in the preceding paragraphs. The layout or the portion thereof as shown in the layout window in FIG. 9 may contain numerous instances of the same pattern as shown in FIG. 8 and thus may contain numerous violations or issues that may negatively impact various aspects of the layout.

Figure 10:
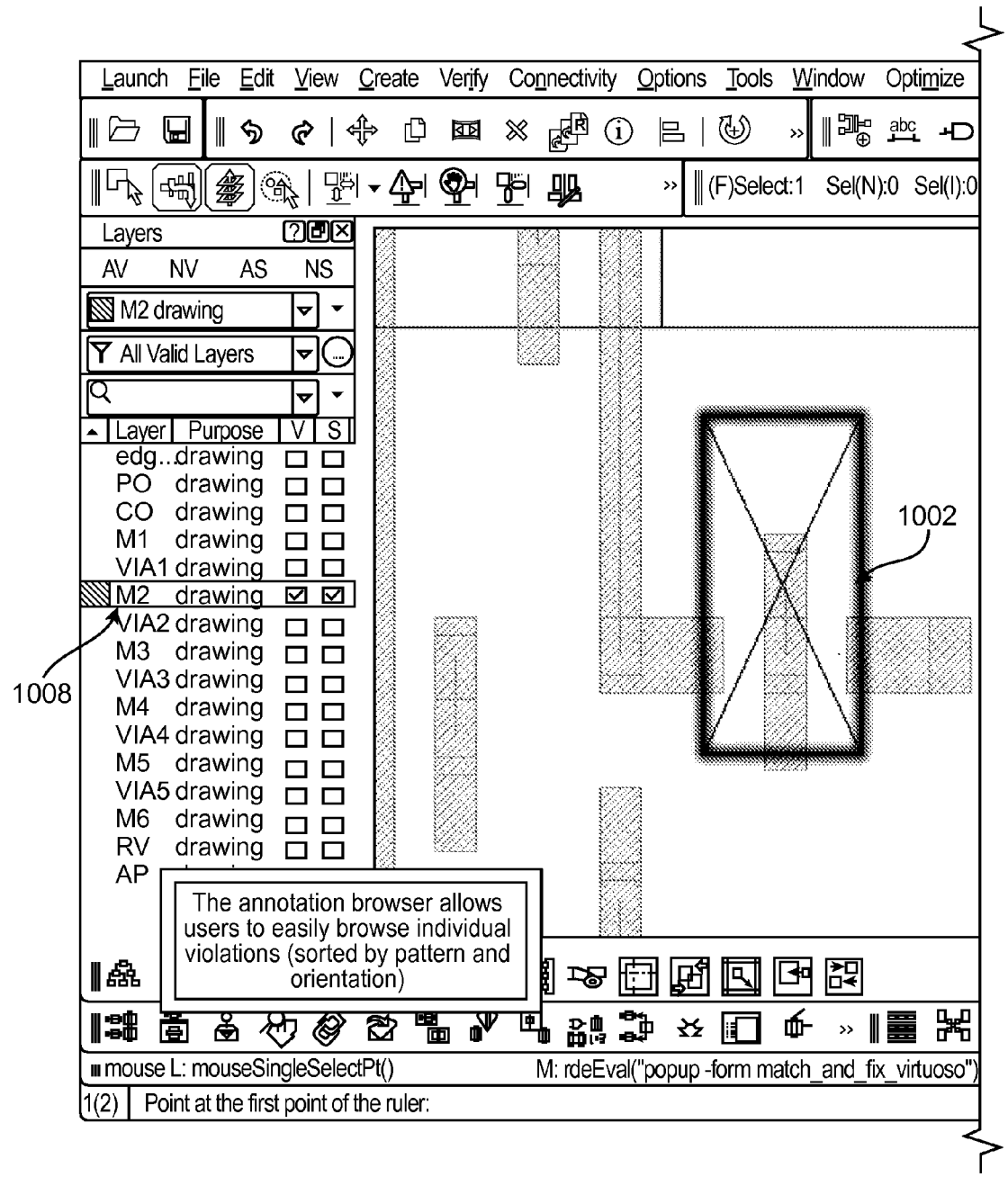
FIG. 10 illustrates the same graphical user interface (GUI) showing in the same layout window of a plurality of patterns in the layout that match the first pattern as illustrated in FIG. 8 by using processes as described with reference to FIG. 2.
Figure 10:
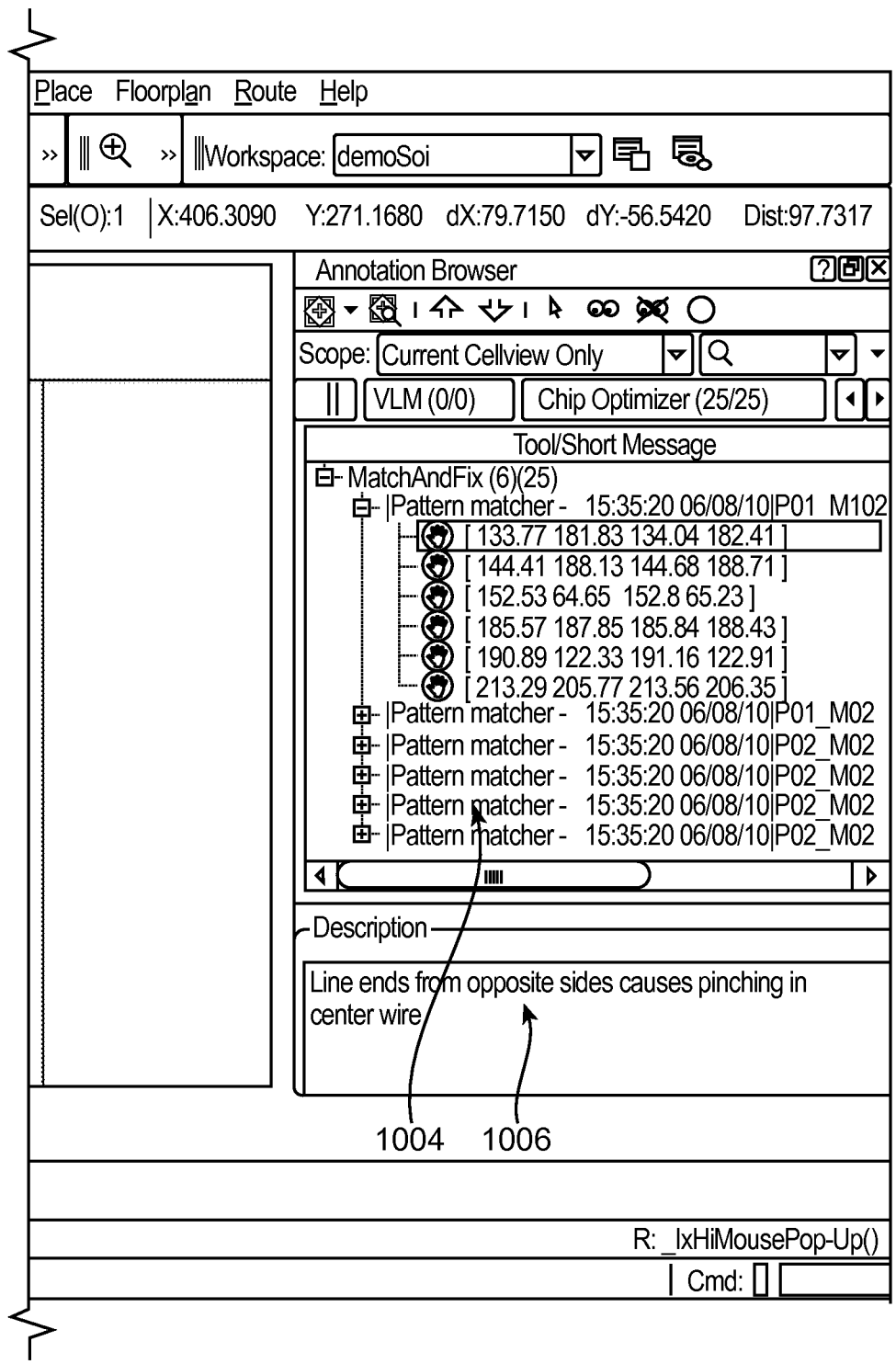

FIG. 10 illustrates the same graphical user interface (GUI) showing in the same layout window of a plurality of patterns in the layout that match the first pattern as illustrated in FIG. 8 by using processes as described with reference to FIG. 2. The matched pattern shown in the layout window is enclosed in the bounding box 1002. FIG. 10 also illustrates the integrated matched pattern browser 1004 that corresponds to or comprises a description field 1006. In these embodiments as illustrated in FIG. 10, some process or module groups the patterns that match the first pattern of FIG. 8 according to their orientations or their pattern types.

For example, the first group of matched pattern that is shown as expanded contains six patterns, each of which is further identified by the coordinates of the four corners of the bounding box 1002. In this illustration, the four coordinates are arranged according to the order of lower-left X, lower-left Y, upper-right X, and upper-right Y. In addition, the description field 1006 provides a brief description of the violation or issue that the highlighted matched pattern gives rise to. In this illustration, the description of the violation or issue states that "Line ends from opposite sides causes pinching in center wire". The other five groups of matched patterns are shown to be collapsed.

The integrated matched pattern browser also shows "MatchAndFix (6)(25)" which indicates that there are a total of six groups of patterns and a total of 25 matched patterns. On the left-hand pane, it can be shown that only the layer M2 is selected, which corresponds to the layer that has been search against to identify matched patterns. It shall be noted that the metal-1 layer (M1 in the pane) is also selectable for various processes or modules to operate on.

Figure 11:
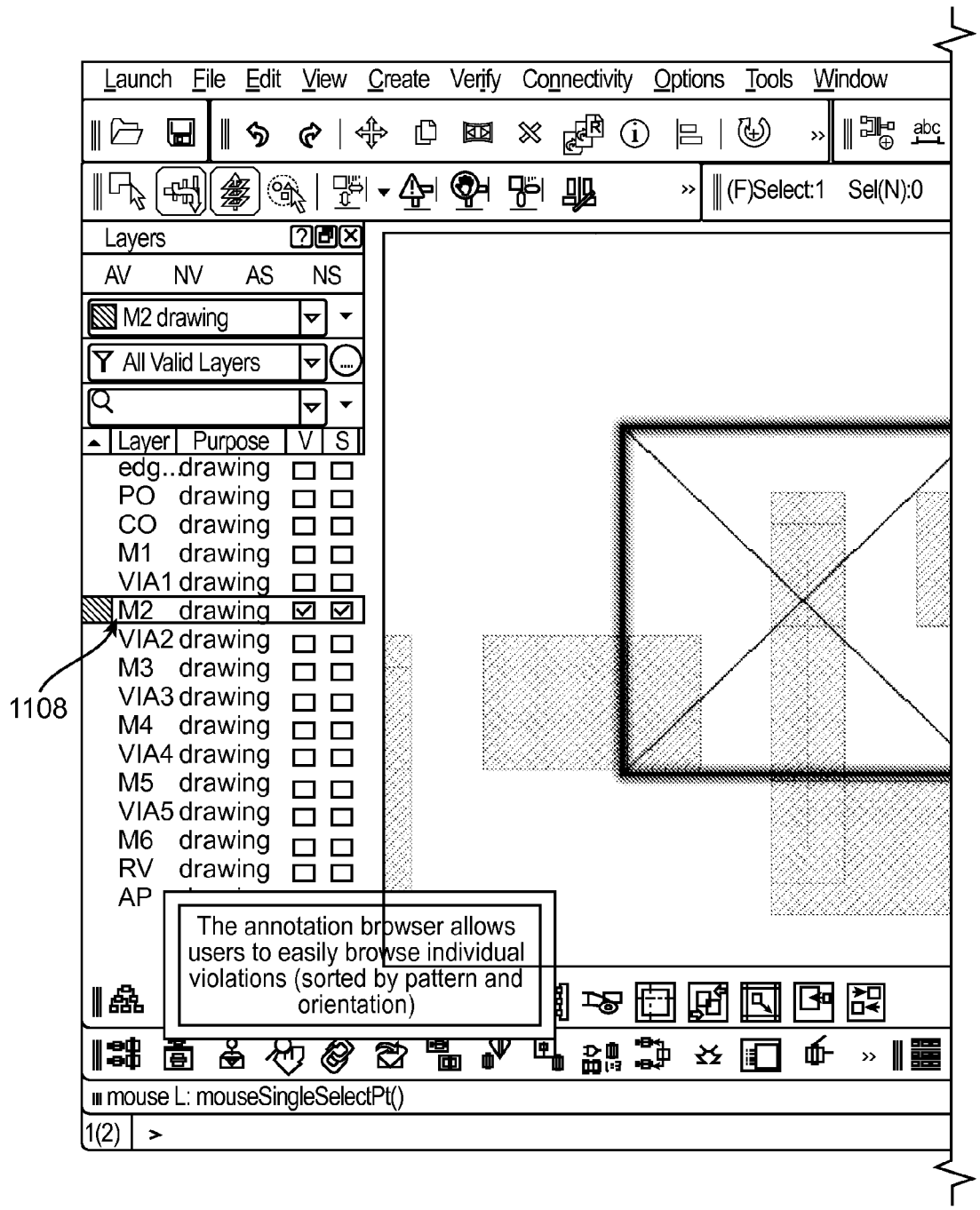
FIG. 11 illustrates the same graphical user interface (GUI) showing in the same layout window a plurality of patterns in the layout that match the first pattern as illustrated in FIG. 8 by using processes as described with reference to FIG. 2.
Figure 11:
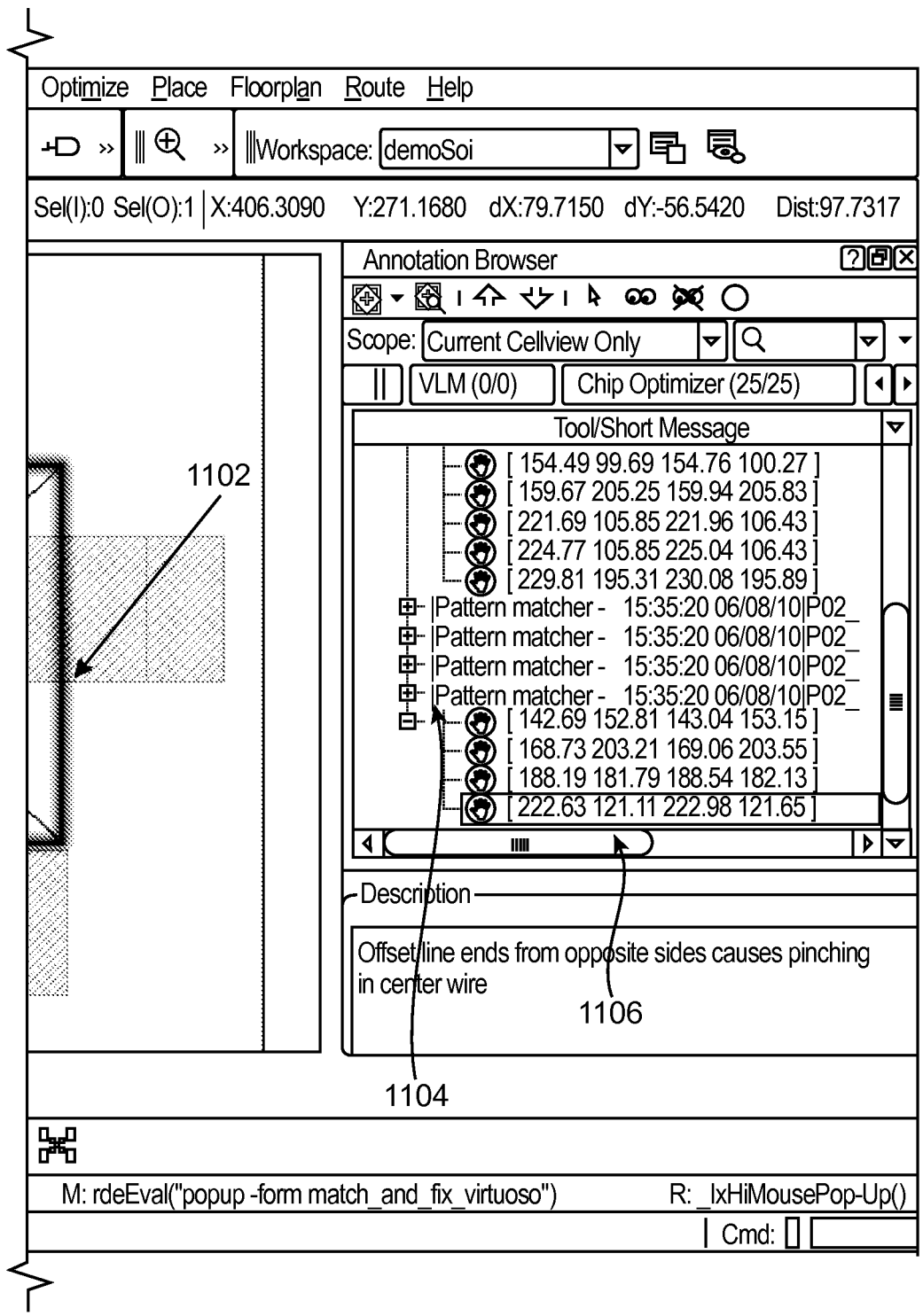

FIG. 11 illustrates the same graphical user interface (GUI) showing in the same layout window a plurality of patterns in the layout that match the first pattern as illustrated in FIG. 8 by using processes as described with reference to FIG. 2. As it can be seen from FIG. 11, another group 1104 of matched patterns is expanded to show the highlighted matched pattern as enclosed in the bounding box 1102. It shall be noted that the pattern type of this highlighted pattern 1106 is different from the highlighted pattern in FIG. 10, and thus these two patterns are grouped into two different groups although they both match the first pattern as shown in FIG. 8. 1108 also indicates that the process or module searches against the layer M1 to identify the matched patterns.

Figure 12:
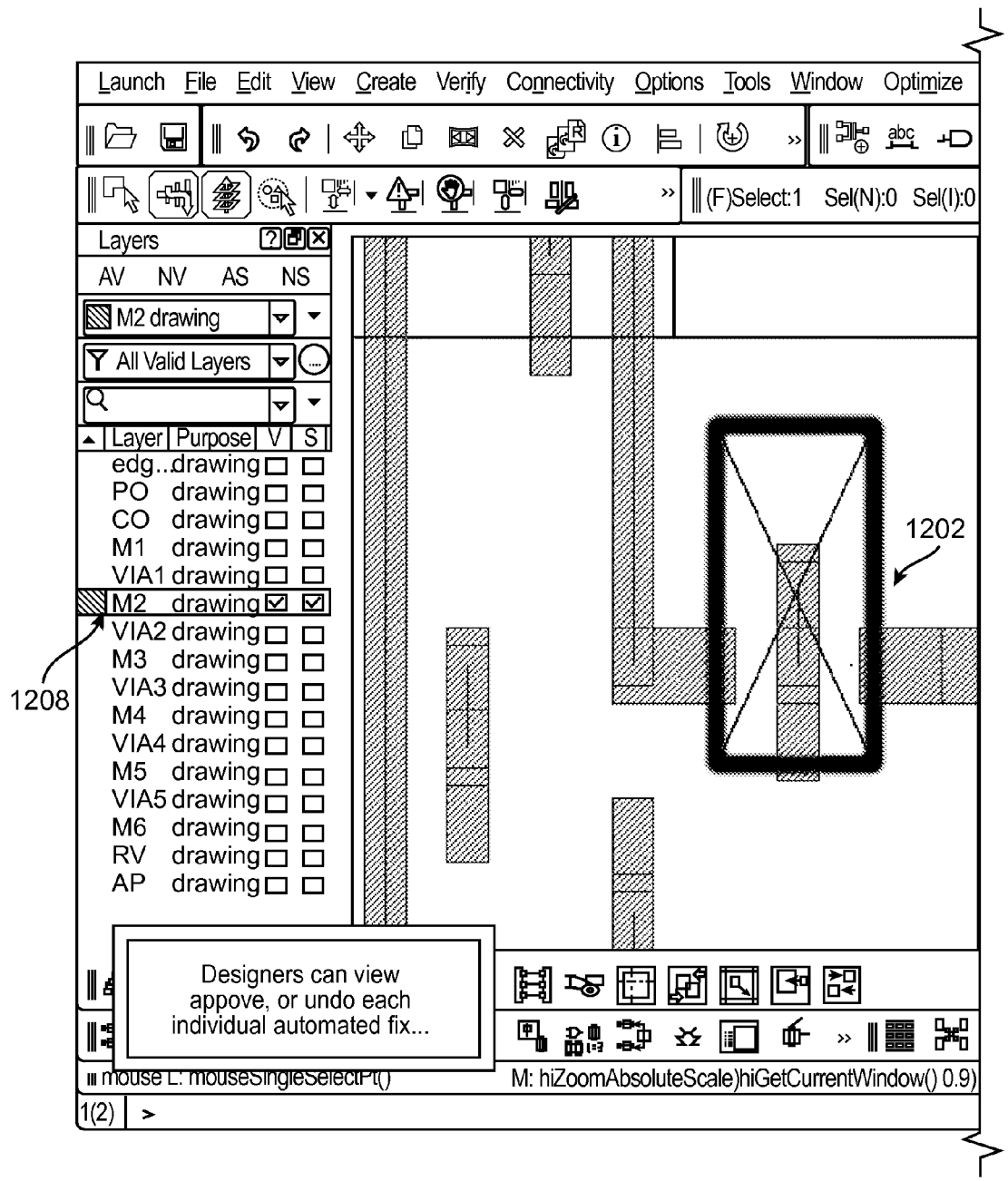
FIG. 12 illustrates the same graphical user interface (GUI) showing in the same layout window a plurality of matched patterns in the layout that match the first pattern as illustrated in FIG. 8 by using one or more fixing processes as described with reference to FIGS. 3-7.
Figure 12:
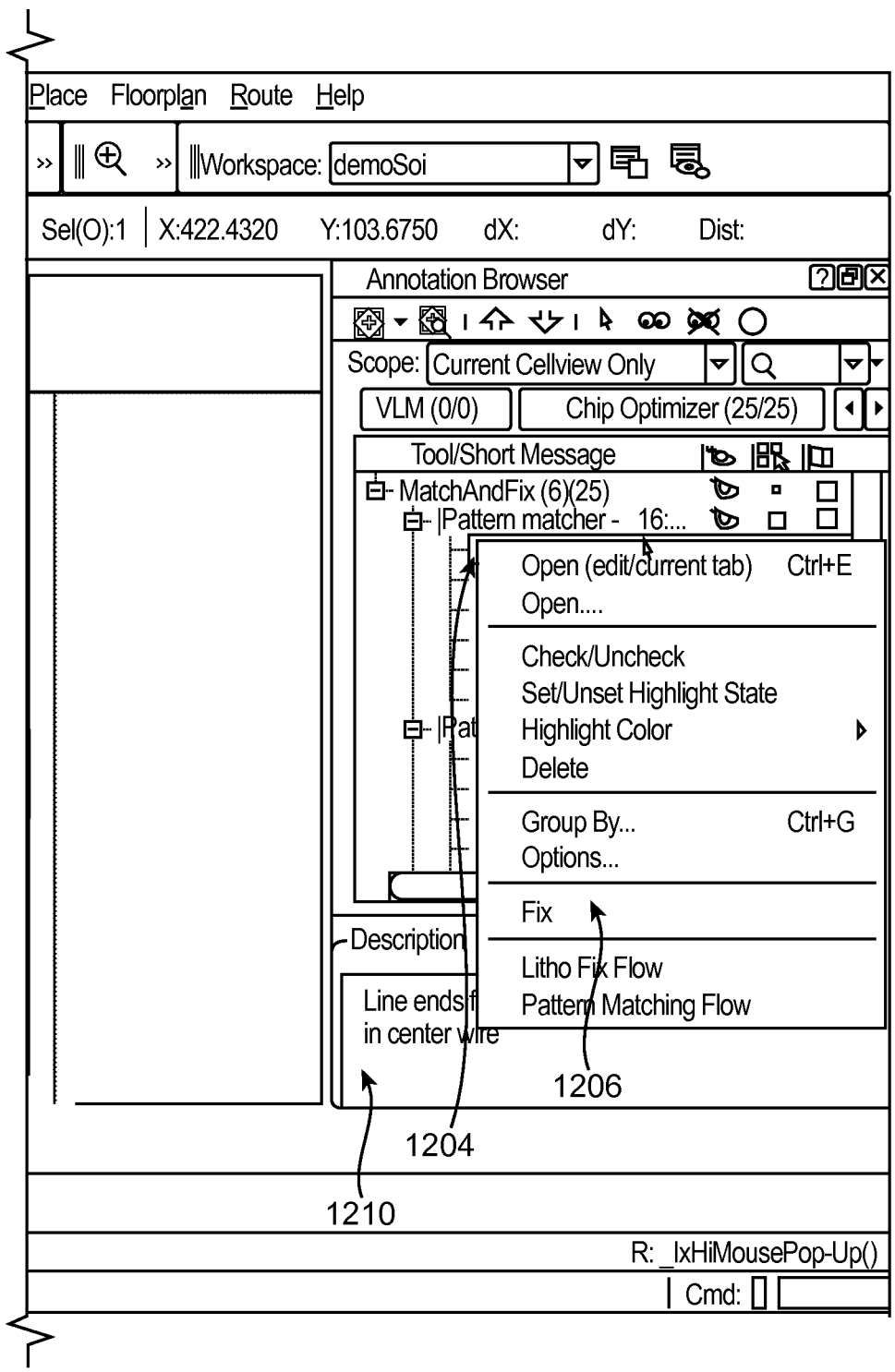

FIG. 12 illustrates the same graphical user interface (GUI) showing in the same layout window a plurality of matched patterns in the layout that match the first pattern as illustrated in FIG. 8 by using one or more fixing processes as described with reference to FIGS. 3-7. The user highlighted the first matched pattern 1204 (partly covered by the context menu) in the first group in the interactive matched pattern browser. The user may then initiate the automatic fixing process of the violation or issue as briefly described in the "Description" field 1210 by selecting the "Fix" process 1206 in the context menu. It shall be noted that the fixing process or module takes place completely within the layout editor. 1208 also indicates that the process or module searches against the layer M1 to identify the matched patterns.

Figure 13:
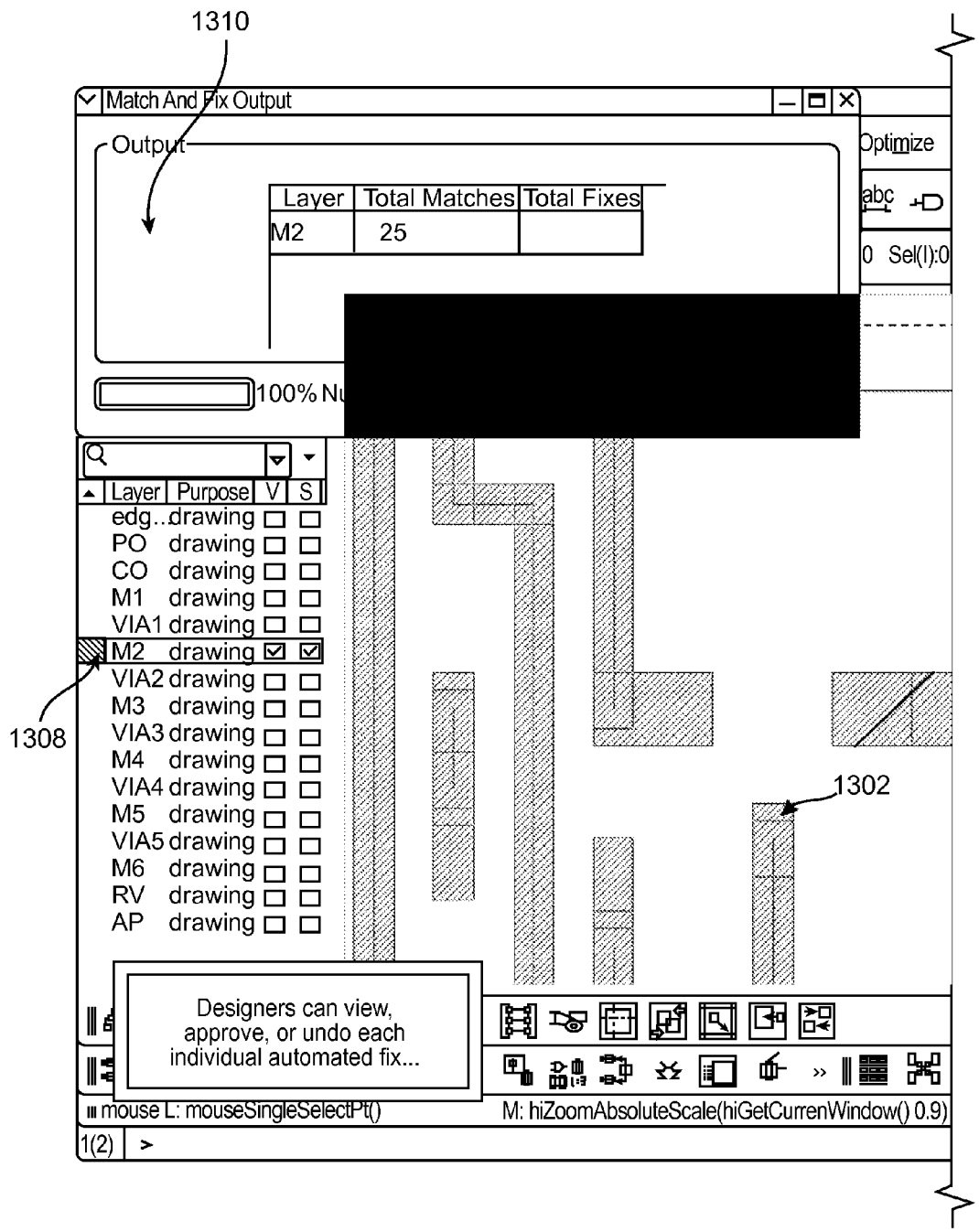
FIG. 13 illustrates the response from the fixing process or module for the matched pattern selected in FIG. 12.
Figure 13:
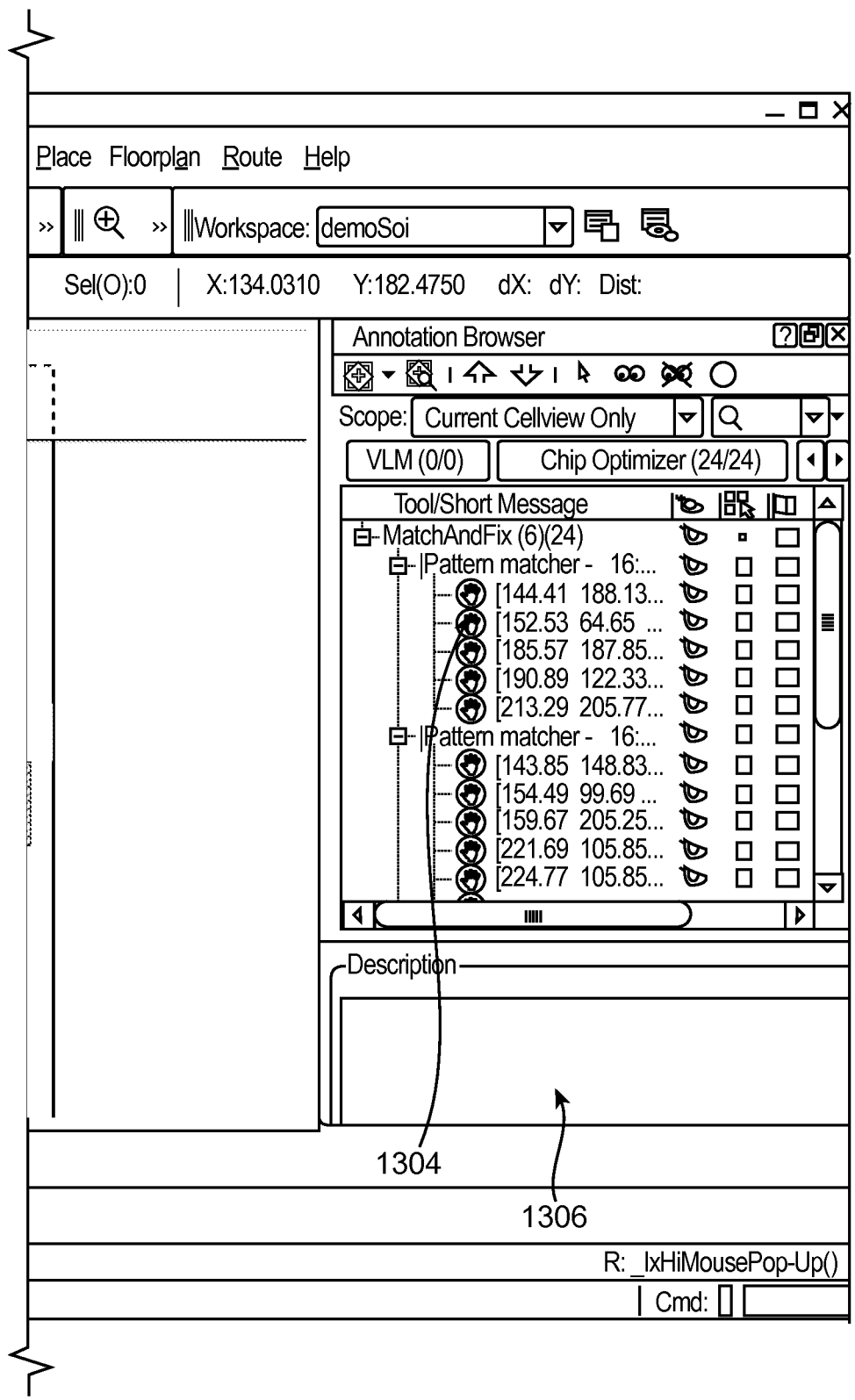

FIG. 13 illustrates the response from the fixing process or module for the matched pattern selected in FIG. 12. It can be seen that the integrated fixing process or module shortens the center wire 1302 and reports that there are total 25 matched patterns on the M2 layer (as indicated by 1308), and one of the 25 matched patterns has been fixed as shown in the dialog box 1310. The interactive matched pattern browser then shows that the M2 layer now contains 24 patterns that match the first pattern that give rise to violations or issues. In other words, the fixing process changes the matched pattern as identified in FIG. 12 into an unmatched pattern, and thus the total number of matched pattern is reduced by one. As the identified matched pattern has been fixed, the Description field 1306 no longer shows any description of the violation or issue.

It shall be noted that the pattern capture and pattern fixing processes or modules take place completely inside the environment of the layout editing module in this illustrated example. In other words, the placement engine, the routing engine, the floorplanning engine, together with the optimize engine are fully integrated within the layout editing module. In some embodiments, one may invoke, call, and initialize the primitives of these existing placement engine, the routing engine, and the floorplanning engine, which are not part of a layout editing module in other commercial EDA suites, from within the layout editing engine via various application programming interfaces (APIs) or application binary interfaces (ABIs) to summon the complete capabilities of these engines without coding these engines into the layout editing engine in some embodiments. In some other embodiments, one may also code these engines into the layout editing tool to achieve the same purpose. It shall also be noted that, in these embodiments where the placement, routing, or floorplanning engineers are integrated within the layout editing module, the layout editing module and these engines are seeing and thus operating upon the same layout in the same memory address areas. Therefore, the layout editing module needs not pass or transmit information or data relating to the layout to these engines, and vice versa.

Figure 14:
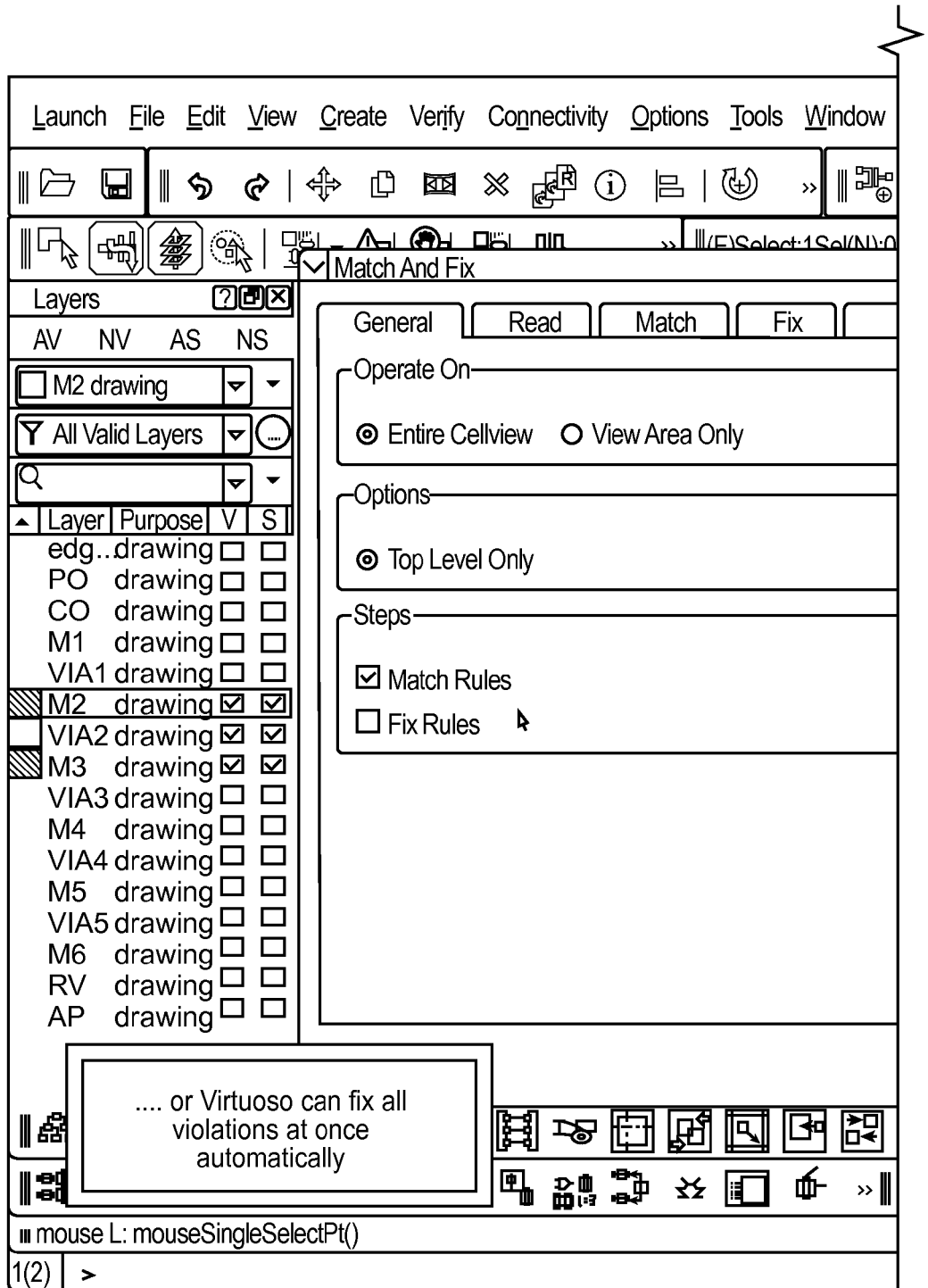
FIG. 14 illustrates the same graphical user interface (GUI) of the same layout editing tool in which various processes or modules perform the pattern capture and pattern fixing as described with reference to FIGS. 3-7.
Figure 14:
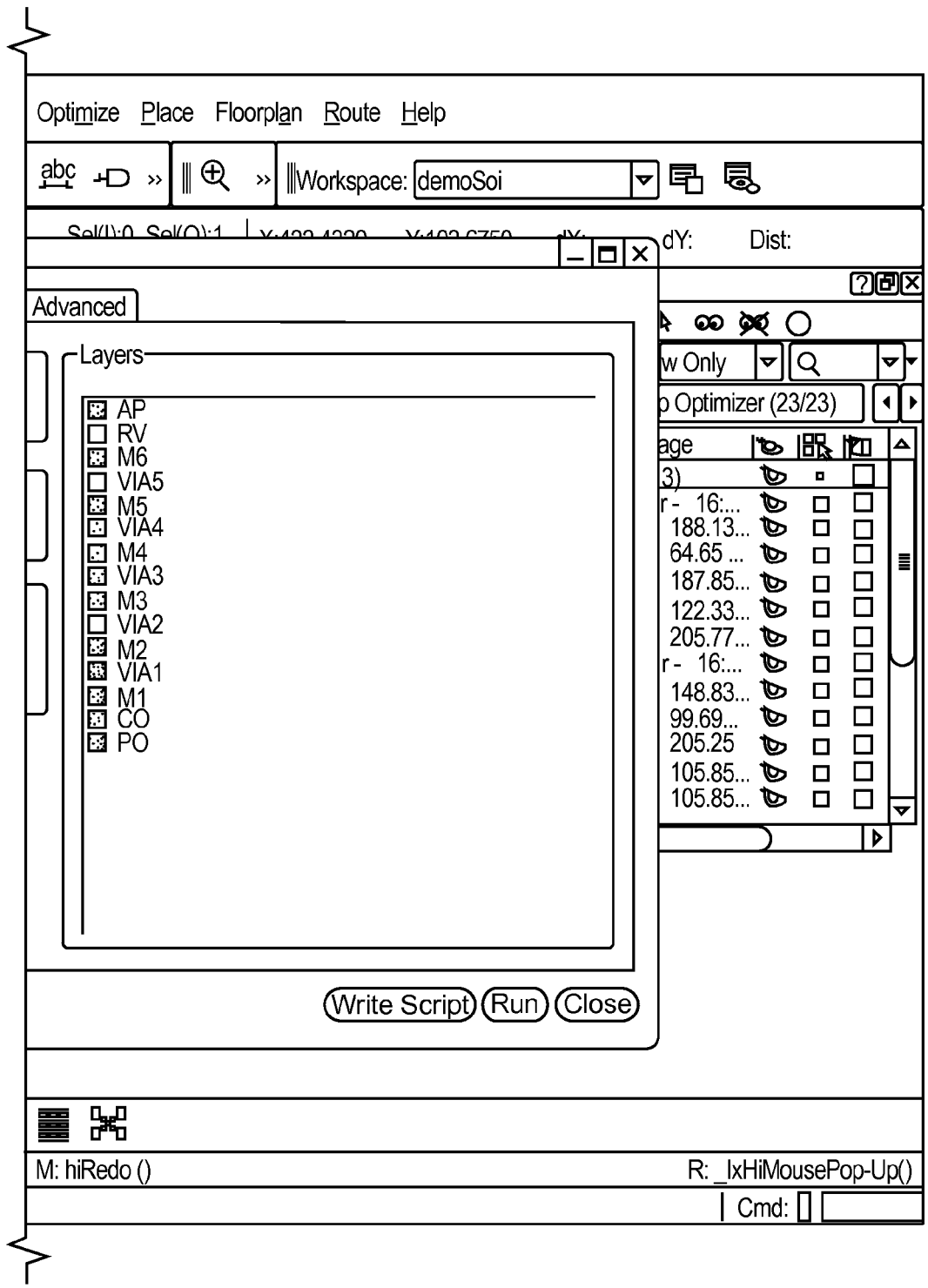

FIG. 14 illustrates the same graphical user interface (GUI) of the same layout editing tool in which various processes or modules perform the pattern capture and pattern fixing as described with reference to FIGS. 3-7. As shown in the interactive dialog box, the user is provided the option to select the match rules or the fix rules or both. In this illustrative example, both the match rules and the fix rules are selected to identify patterns that match the first pattern as shown in FIG. 8.

Figure 15:
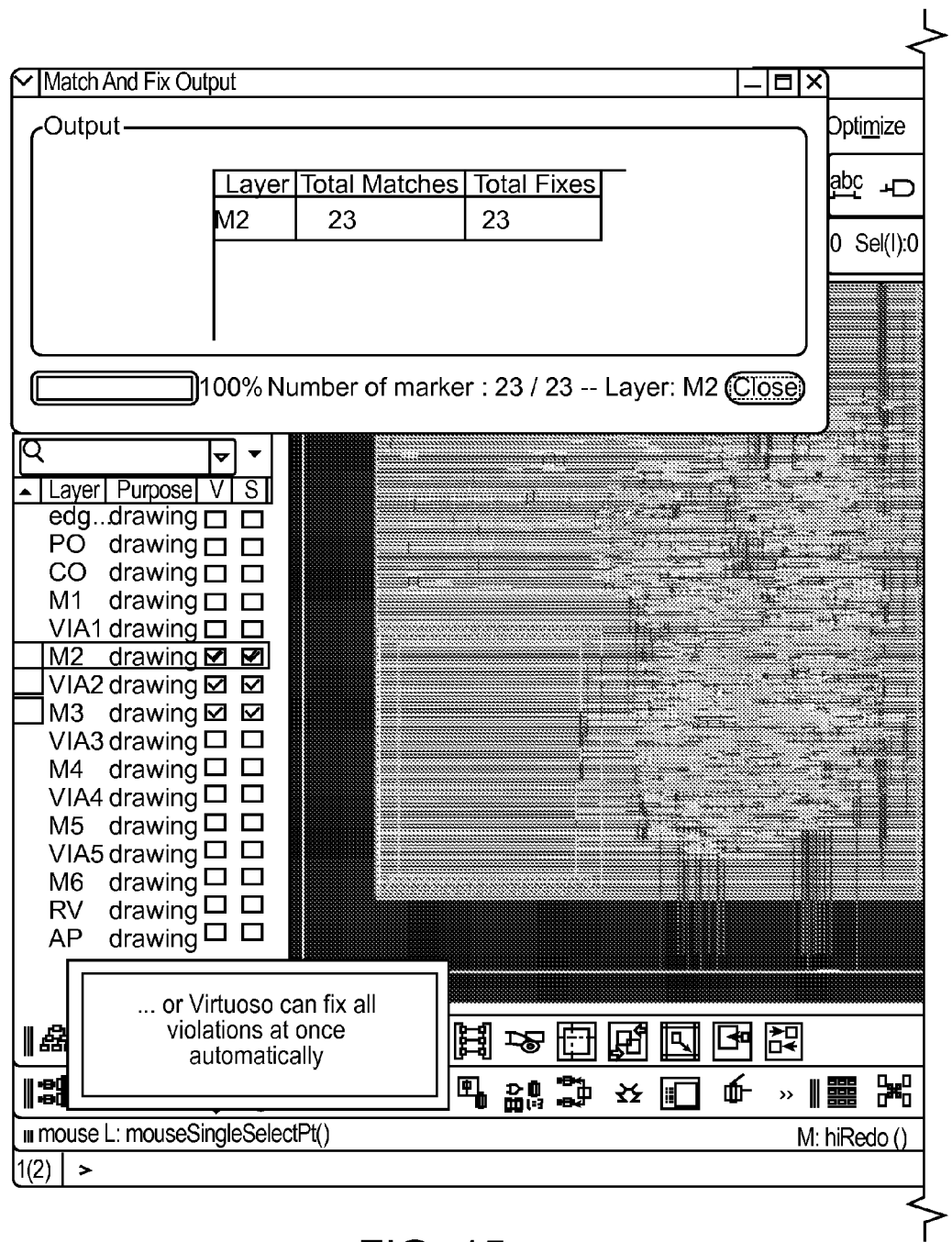
FIG. 15 illustrates the search results and the fix results of the pattern capture and pattern fixing processes or modules as illustrated in FIG. 14.
Figure 15:
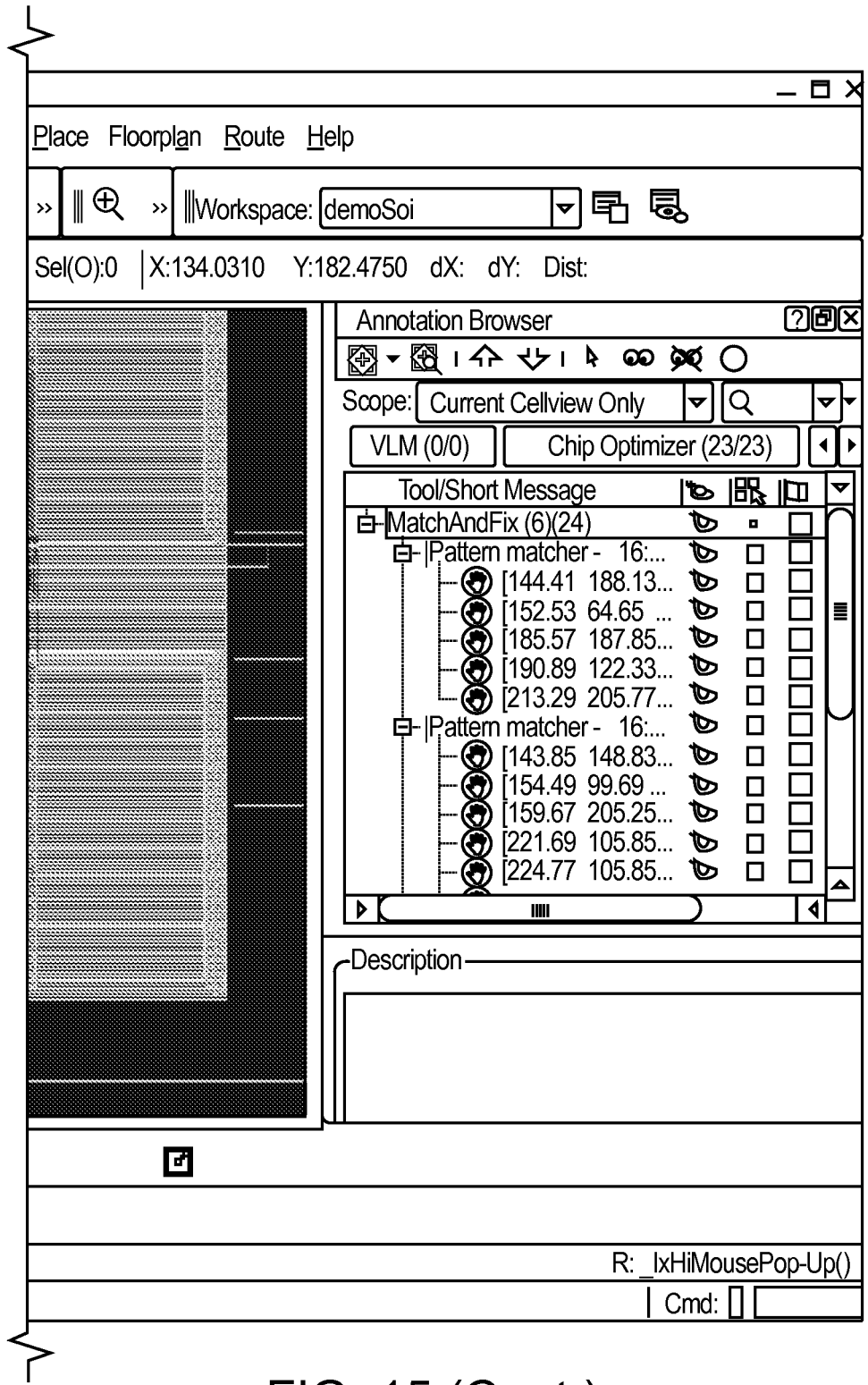

FIG. 15 illustrates the search results and the fix results of the pattern capture and pattern fixing processes or modules as illustrated in FIG. 14. As it can be seen from FIG. 15 that the processes or modules search against the layer M2 and identify 23 patterns in six groups that match the first pattern as shown in FIG. 8. The fixing processes or modules are also applied to fix the violations among the matched patterns. As a result, FIG. 15 further illustrates that there are 23 matched patterns on M2, and all 23 matched patterns have been fixed by the integrated fixing module. It shall be noted that the pattern capture and pattern fixing processes or modules take place completely within the layout editing module.

System Architecture Overview

Figure 16:
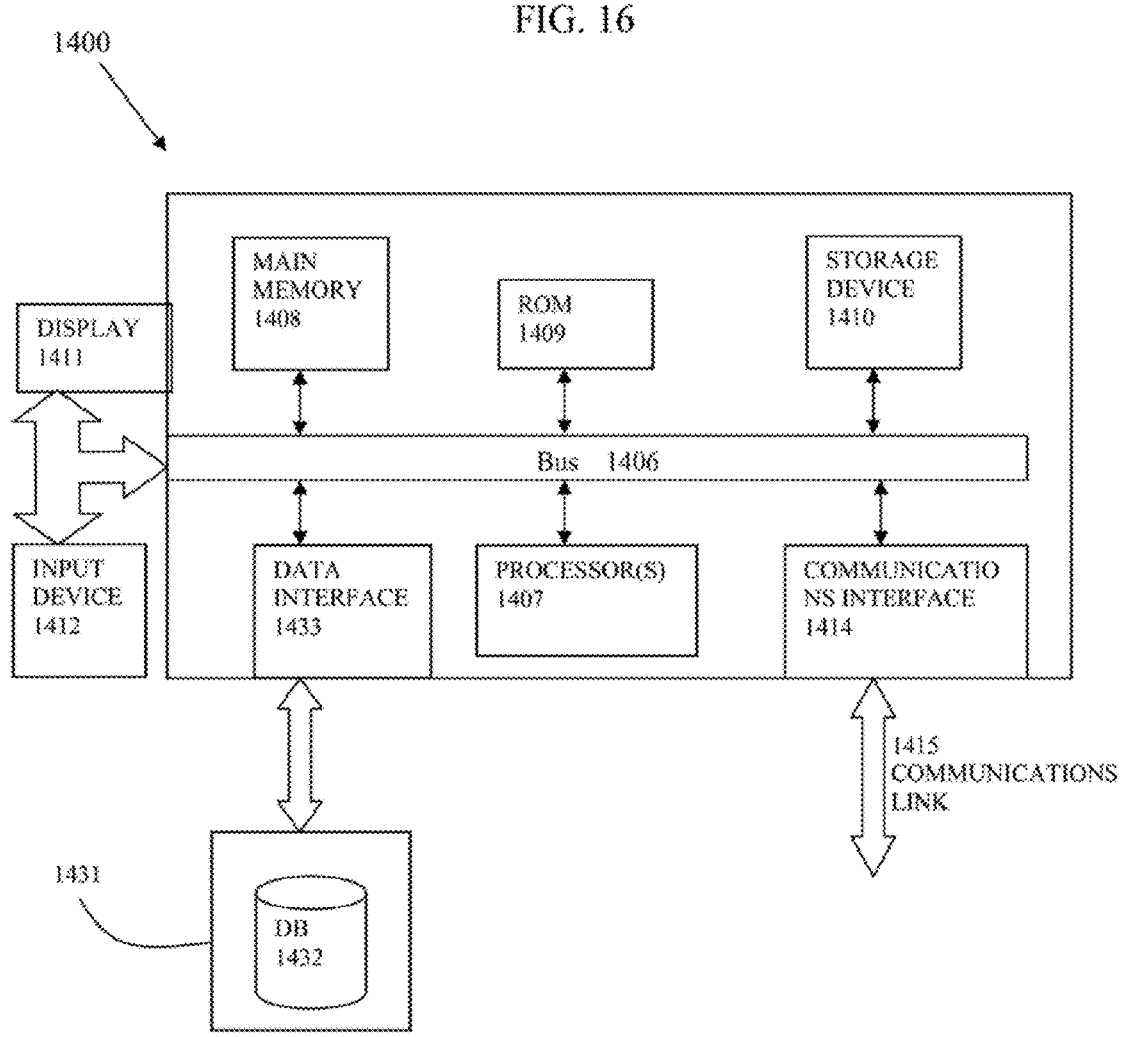
FIG. 16 illustrates a block diagram of an illustrative computing system 1400 suitable for implementing various embodiments of various methods or processes described herein.

FIG. 16 illustrates a block diagram of an illustrative computing system 1400 suitable for implementing various embodiment of the invention. For example, the exemplary computing system 1400 may be used to implement various processes as described in the preceding paragraphs and the figures such as various identifying or determining processes or modules, various analysis processes or modules, various processes or modules for performing various actions, etc. as described in the remainder of the Application. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control (not shown).

According to one embodiment of the invention, computer system 1400 performs specific operations by one or more processors or processor cores 1407 executing one or more sequences of one or more instructions contained in system memory 1408. Such instructions may be read into system memory 1408 from another computer readable/usable storage medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention. In the single embodiment or in some embodiments, the one or more processors or processor cores 1407 may be used to perform various actions such as various actions, processes, or modules involving determining, analyzing, performing actions, etc. In some embodiments, at least one of the one or more processors or processor cores 1407 has the multithreading capability.

In one embodiment, the term "logic" shall mean any combination of software or hardware that is used to implement all or part of the invention. In the single embodiment or in some embodiments, the one or more processors or processor cores 1407 may be used to perform various acts such as various acts involving determining, analyzing, performing actions, etc. In some embodiments, at least one of the one or more processors or processor cores 1407 has the multithreading capability to execute a plurality of threads to perform various tasks as described in the preceding sections.

Various actions as described in the preceding paragraphs may be performed by using one or more processors, one or more processor cores, or combination thereof 1407. For example, various processes or modules involving the determining action, various analysis processes or modules, etc. may be performed by one or more processors, one or more processor cores, or combination thereof.

The term "computer readable storage medium" or "computer usable storage medium" as used herein refers to any non-transitory medium that participates in providing instructions to processor 1407 for execution. Such a medium may take many forms, including but not limited to, non-volatile media and volatile media. Non-volatile media includes, for example, solid-state drives, optical or magnetic disks, such as disk drive 1410. Volatile media includes dynamic memory, such as system memory 1408.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), a magnetic tape, any other magnetic or a magneto-optical medium, CD-ROM, any other optical medium, punch cards, paper tape, any other physical medium with patterns of holes, RAM, PROM, EPROM, FLASH-EPROM, any other memory chip or cartridge, or any other medium from which a computer can read. For example, the various forms of computer readable storage media may be used by the methods or the systems to store either temporarily or permanently information or data such as the matched patterns, one or more patterns with embedded or associated fixing processes, post-fixing layout, etc.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, e.g., application code, through communication link 1415 and communication interface 1414. Received program code may be executed by processor 1407 as it is received, and/or stored in disk drive 1410, or other non-volatile storage for later execution. In an embodiment, the computer system 1400 operates in conjunction with a data storage system 1431, e.g., a data storage system 1431 that contains a database 1432 that is readily accessible by the computer system 1400. The computer system 1400 communicates with the data storage system 1431 through a data interface 1433. A data interface 1433, which is coupled to the bus 1406, transmits and receives electrical, electromagnetic or optical signals that include data streams representing various types of signal information, e.g., instructions, messages and data. In embodiments of the invention, the functions of the data interface 1433 may be performed by the communication interface 1414.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for implementing fuzzy pattern replacement in a layout of an electronic circuit design, the method comprising:

using at least one processor that is programmed or configured for performing a process comprising:

identifying a first set of one or more layers or purposes;

identifying a first pattern from in the first set of one or more layers or purposes within the layout by at least excluding an area in the first pattern from consideration in identifying the one or more second patterns based at least in part upon the first pattern;

identifying one or more second patterns based at least on the first pattern; and performing the fuzzy pattern replacement by replacing the first pattern with at least one of the one or more second patterns that is considered as a fuzzy match for the first pattern in a fuzzy matter in the layout.

2. The computer implemented method of claim 1, the process further comprising:

determining a decomposition scheme that decomposes the first pattern into a plurality of sub-patterns for a double patterning process.

3. The computer implemented method of claim 1, the process further comprising:

determining a decomposition scheme that decomposes the first pattern into a plurality of layers or purposes, in which the plurality of layers or purposes have been verified for manufacturability, performance, functionality, yield, or correctness.

4. The computer implemented method of claim 1, in which the first pattern comprises a fuzzy pattern.

5. The computer implemented method of claim 1, in which the act for identifying the one or more second patterns comprises:

searching for the one or more second patterns that approximately match the first pattern against the first set of one or more layers or purposes.

6. The computer implemented method of claim 1, in which the act for identifying the one or more second patterns that match the first pattern comprises:
    searching for the one or more second patterns that match the first pattern against a second set of one or more layers or purposes, in which the second set is different from the first set.

7. The computer implemented method of claim 1, in which the act for identifying the one or more second patterns that match the first pattern comprises:
    determining a match metric for the process of identifying the one or more second patterns that match the first pattern.

8. The computer implemented method of claim 7, in which the act for identifying the one or more second patterns comprises:
    identifying or determining an area in the first pattern or at least one of the one or more second patterns; and
    determining the match metric by using area correlation between the first pattern and the at least one of the one or more second patterns.

9. The computer implemented method of claim 8, in which the act for identifying or determining the area comprises:
    scanning the area to determine a modification for the first pattern or at least one of the one or more second patterns; and
    determining one or more modifications for the at least one of the one or more second patterns.

10. The computer implemented method of claim 8, in which the area comprises at least one of a don't-care area, an empty area, and a key area in the first pattern or the one or more second patterns.

11. The computer implemented method of claim 1, the process further comprising:
    determining the at least one of the one or more second patterns based at least in part upon a context in which the first pattern resides.

12. The computer implemented method of claim 11, in which the context comprises information or data about one or more geometries within a range of the first pattern in the electronic circuit design or an environment in which the first pattern is situated.

13. The computer implemented method of claim 1, the process further comprising:
    adjusting the at least one of the one or more second patterns after the at least one of the one or more of second patterns is used to replace the first pattern to improve the electronic circuit design.

14. The computer implemented method of claim 1, the process further comprising:
    determining whether the one or more second patterns meet a requirement for the fuzzy pattern replacement.

15. The computer implemented method of claim 14, the process for determining whether the one or more second patterns meet the requirement further comprising:
    determining whether at least one of the one or more second patterns meet a requirement for the fuzzy pattern replacement after modifying the first pattern to form the at least one of the one or more second pattern.

16. The computer implemented method of claim 1, the process further comprising:
    storing information or data about the fuzzy pattern replacement that replaces the first pattern with the at least one of the one or more second patterns in one or more logs or macros.

17. The computer implemented method of claim 16, the process further comprising at least one of:
    undoing one or more first fuzzy pattern placements as a result of the act of performing the fuzzy pattern replacement to restore the electronic circuit design to one or more prior states by applying at least a first portion of the one or more logs or macros to the electronic circuit design; and
    redoing one or more second pattern fuzzy placements to change a state of the electronic circuit design to one or more other states by applying at least a second portion of the one or more logs or macros to the electronic circuit design.

18. A computer system for implementing fuzzy pattern replacement in a layout of an electronic circuit design, comprising:
    at least one processor that is at least to:
        identify a first set of one or more layers or purposes;
        identify a first pattern from in the first set of one or more layers or purposes within the layout;
        identify one or more second patterns based at least upon the first pattern by at least excluding an area from the first pattern in identifying the one or more second patterns based at least in part upon the first pattern; and
        perform the fuzzy pattern replacement by replacing the first pattern with at least one of the one or more second patterns that is considered as a fuzzy match for the first pattern in a fuzzy matter in the layout.

19. The system of claim 18, in which the at least one processor is further to:
    determine a decomposition scheme that decomposes the first pattern into a plurality of sub-patterns for a double patterning process;
    determine a second decomposition scheme that decomposes the first pattern into a plurality of additional layers or purposes, in which the plurality of additional layers or purposes have been verified for manufacturability, performance, functionality, yield, or correctness;
    determine the at least one of the one or more second patterns based at least in part upon a context in which the first pattern resides;
    adjust the at least one of the one or more second patterns after the at least one of the one or more of second patterns is used to replace the first pattern to improve the electronic circuit design; and
    determine whether the one or more second patterns meet a requirement for the fuzzy pattern replacement.

20. The system of claim 18, wherein the at least one processor is further to:
    store information or data about the fuzzy pattern replacement that replaces the first pattern with the at least one of the one or more second patterns in one or more logs or macros.

21. The computer implemented method of claim 20, wherein the at least one processor is further to:
    undo one or more first fuzzy pattern placements to restore the electronic circuit design to one or more prior states by applying at least a first portion of the one or more logs or macros to the electronic circuit design; or
    redo one or more second fuzzy pattern placements to change a state of the electronic circuit design to one or more other states by applying at least a second portion of the one or more logs or macros to the electronic circuit design.

22. The system of claim 18, in which the at least one processor that is to identify the one or more second patterns is further to:
search for the one or more second patterns against the first set of one or more layers or purposes or against a second set of one or more layers or purposes, in which the second set is different from the first set; and
determine a match metric for the process of identifying the one or more second patterns that match the first pattern, in which the at least one processor that is to identify the one or more second patterns is further to:
identify or determine an area in the first pattern or at least one of the one or more second patterns; and
determine the match metric by using area correlation between the first pattern and the at least one of the one or more second patterns.

23. An article of manufacture comprising a non-transitory computer readable storage medium having stored thereupon a sequence of instructions which, when executed by at least one processor, causes the at least one processor to perform a process for implementing fuzzy pattern replacement in a layout of an electronic circuit design, the process comprising:
using the at least one processor to performing one or more actions as follows;
identifying a first set of one or more layers or purposes;
identifying a first pattern from in the first set of one or more layers or purposes within the layout;
identifying one or more second patterns based at least upon the first pattern by at least excluding an area from the first pattern in identifying the one or more second patterns based at least in part upon the first pattern; and
performing the fuzzy pattern replacement by replacing the first pattern with at least one of the one or more second patterns that is considered as a fuzzy match for the first pattern in a fuzzy matter in the layout.

24. The article of manufacture of claim 23, the process further comprising at least one of:
determining a decomposition scheme that decomposes the first pattern into a plurality of sub-patterns for a double patterning process;
determining a second decomposition scheme that decomposes the first pattern into a plurality of additional layers or purposes, in which the plurality of additional layers or purposes have been verified for manufacturability, performance, functionality, yield, or correctness;
determining the at least one of the one or more second patterns based at least in part upon a context in which the first pattern resides;
adjusting the at least one of the one or more second patterns after the at least one of the one or more of second patterns is used to replace the first pattern to improve the electronic circuit design; and
determining whether the one or more second patterns meet a requirement for the fuzzy pattern replacement.

25. The article of manufacture of claim 23, the process further comprising:
storing information or data about the fuzzy pattern replacement that replaces the first pattern with the at least one of the one or more second patterns in one or more logs or macros.

26. The article of manufacture of claim 25, the process further comprising at least one of:
undoing one or more first fuzzy pattern placements to restore the electronic circuit design to one or more prior states by applying at least a first portion of the one or more logs or macros to the electronic circuit design; and
redoing one or more second fuzzy pattern placements to change a state of the electronic circuit design to one or more other states by applying at least a second portion of the one or more logs or macros to the electronic circuit design.

27. The article of manufacture of claim 23, in which the action for identifying the one or more second patterns that match the first pattern further comprises:
searching for the one or more second patterns that match the first pattern against the first set of one or more layers or purposes or against a second set of one or more layers or purposes, in which the second set is different from the first set; and
determining a match metric for the process of identifying the one or more second patterns that match the first pattern, in which the process for identifying the one or more second patterns comprises:
identifying or determining an area in the first pattern or at least one of the one or more second patterns; and
determining the match metric by using area correlation between the first pattern and the at least one of the one or more second patterns.

* * * * *